US012803592B2

(12) United States Patent
Buehler et al.

(10) Patent No.: US 12,803,592 B2

(45) Date of Patent: Nov. 17, 2026

(54) MODIFIED BELIEF PROPAGATION DECODER ALLOWING FOR OUT OF CONTEXT SYNTHESIS

(71) Applicant: International Business Machines Corporation, Armonk, NY (US)

(72) Inventors: Markus Buehler, Weil im Schoenbuch (DE); Thilo Maurer, Nufringen (DE); Michael Klaus Kroener, Ehningen (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 68 days.

(21) Appl. No.: 18/985,570

(22) Filed: Dec. 18, 2024

(65) Prior Publication Data

US 2026/0172051 A1 Jun. 18, 2026

(51) Int. Cl.
*H03M 13/11* (2006.01)
*G06N 10/70* (2022.01)

(52) U.S. Cl.
CPC ........ *H03M 13/1105* (2013.01); *G06N 10/70* (2022.01); *H03M 13/1148* (2013.01)

(58) Field of Classification Search
CPC .......... H03M 13/1105; H03M 13/1148; G06N 10/70
See application file for complete search history.

(56) References Cited

U.S. PATENT DOCUMENTS

2008/0235561 A1* 9/2008 Yang ..................... H04L 1/0057 714/801
2025/0148344 A1* 5/2025 Ha ......................... G06N 10/70

OTHER PUBLICATIONS

Bravyi et al., High-Threshold and Low-Overhead Fault-Tolerant Quantum Memory arXiv:2308.07915v2 [quant-ph], Feb. 22, 2024, 36 pages.
Valls et al., "Syndrome-Based Min-Sum vs OSD-0 Decoders: FPGA Implementation and Analysis for Quantum LDPC Codes" IEEE Access, Oct. 15, 2021, 10 Pages.
Unknown, AMD Vivado, Last accessed on Sep. 5, 2024, https://www.amd.com/en.html.
Unknown, Synopsys Synplify, Last accessed on Sep. 5, 2024, https://www.synopsys.com/.
Hillmann et al., "Localized Statistics Decoding: A Parallel Decoding Algorithm for Quantum Low-Density Parity-Check Codes", arXiv:2406.18655v1 [quant-ph] Jun. 26, 2024, 21 pages.
International Searching Authority, Notification of Transmittal of the International Search Report and the Written Opinion of the International Searching Authority, International Application No. PCT/EP2025/087458, Mar. 18, 2026, 12 pages.
Scruby et al., "Local Probabilistic Decoding of a Quantum Code", arXiv:2212.06985v3 [quant-ph] Aug. 22, 2023, 11 pages.

* cited by examiner

*Primary Examiner* — Thien Nguyen
(74) *Attorney, Agent, or Firm* — Amin, Turocy & Watson, LLP

(57) ABSTRACT

A system comprises a separating component that separates a decoder matrix, representing node units of a quantum error correction process, into a first part and a second part, by executing a cut through a selected node unit, of the node units, and a decoding component that decodes a syndrome, of the quantum error correction process, by directing evaluation of the syndrome by the first part independent from evaluation of the syndrome by the second part.

20 Claims, 15 Drawing Sheets

MODIFIED BELIEF PROPAGATION DECODER ALLOWING FOR OUT OF CONTEXT SYNTHESIS

BACKGROUND

The subject disclosure relates to quantum computing systems and more specifically to quantum error correction processes for addressing an error at a quantum output of a quantum computing system, where the quantum error correction processes employ modified belief propagation using out of context synthesis.

SUMMARY

The following presents a summary to provide a basic understanding of one or more embodiments described herein. This summary is not intended to identify key or critical elements, and/or to delineate scope of particular embodiments or scope of claims. Its sole purpose is to present concepts in a simplified form as a prelude to the more detailed description that is presented later. In one or more embodiments, systems, computer-implemented methods, apparatuses and/or non-transitory, computer-readable mediums described herein can provide for quantum error correction relative to a large quantity, such as hundreds or more, of qubits employed at a quantum system. The one or more embodiments can address a correspondingly large decoder matrix of a quantum error correction process employed to address a quantum output of such quantum system.

In accordance with an embodiment, a system can comprise a separating component that separates a decoder matrix, representing node units of a quantum error correction process, into a first part and a second part, by executing a cut through a selected node unit, of the node units, and a decoding component that decodes a syndrome, of the quantum error correction process, by directing evaluation of the syndrome by the first part independent from evaluation of the syndrome by the second part.

In accordance with another embodiment, a computer-implemented method can comprise separating, by a system operatively coupled to a processor, a decoder matrix, representing node units of a quantum error correction process, and realized by cells defining rows and columns of the decoder matrix, into a first part and a second part, by executing a cut through a selected node unit, of the node units; and decoding, by the system, a syndrome, of the quantum error correction process, by directing evaluation of the syndrome by the first part independent from evaluation of the syndrome by the second part.

In accordance with still another embodiment, a non-transitory computer-readable medium, facilitating use of a decoder matrix of a quantum error correction process, the non-transitory, computer-readable medium having program instructions embodied therewith, the program instructions being executable to: separate a decoder matrix, representing node units of a quantum error correction process, and realized by cells defining rows and columns of the decoder matrix, into a first part and a second part, by executing a cut through a selected node unit, of the node units; and decode a syndrome, of the quantum error correction process, by directing evaluation of the syndrome by the first part independent from evaluation of the syndrome by the second part.

A benefit of the system, computer-implemented method and/or non-transitory computer-readable medium can be an ability to address a quantity of errors of a quantum output corresponding to use of a quantum system having hundreds or even thousands of qubits. In particular a unique belief propagation process can be employed for quantum error correction using out of context synthesis to reduce complexity of the belief propagation process. Existing frameworks using belief propagation are unable to address such large quantum systems and/or quantum outputs associated therewith, and instead are prone to faulting of existing belief propagation processes.

Another benefit of the system, computer-implemented method and/or non-transitory computer-readable medium can be an ability to reduce complexity of a decoder matrix, such as represented by a Tanner graph, of a belief propagation process used for quantum error correction. Reduction in complexity can result in reduced time, power, bandwidth, manual labor and/or cost being directed to error correction processes using belief propagation. Reduction in complexity can comprise separation of a decoder matrix into two or more parts based on cutting of one or more node units of the decoder matrix (e.g., one or more variable node units or one or more check node units), and determination of outputs for the two or more parts independent from one another, but using partial outputs from each part for determining a final output for any one of the two or more parts. Accordingly, a part of the decoder matrix, and its outputs, can be addressed out of context of a remainder of the belief propagation framework, e.g., out of context of the remaining decoder matrix. Thereafter, the outputs of each part can be communicated to next parts along the decoder matrix to facilitate decoding a syndrome.

Still another benefit of the system, computer-implemented method and/or non-transitory computer-readable medium can be an ability to reduce a vector of connections between nodes of the detector matrix that communicate with one another in series to result in one or more synthesized outputs. For example, instead of progressing through a vector of a full decoder matrix, the one or more embodiments described herein can address discrete parts (e.g., also referred to as subunits and/or submatrices) of the decoder matrix out of context from the remainder of the full decoder matrix. Accordingly, a part can be evaluated by using an assumption that connections to nodes upstream or downstream of the part have been cut at the decoder matrix, at least for the purpose of the out of context belief propagation synthesis of the part. Where parts are identified specifically as repeating parts that repeat at one or more different locations of the decoder matrix, same output results can be employed for the repeat parts, significantly reducing the workload to synthesize the full decoder matrix.

DETAILED DESCRIPTION

Figure 1:
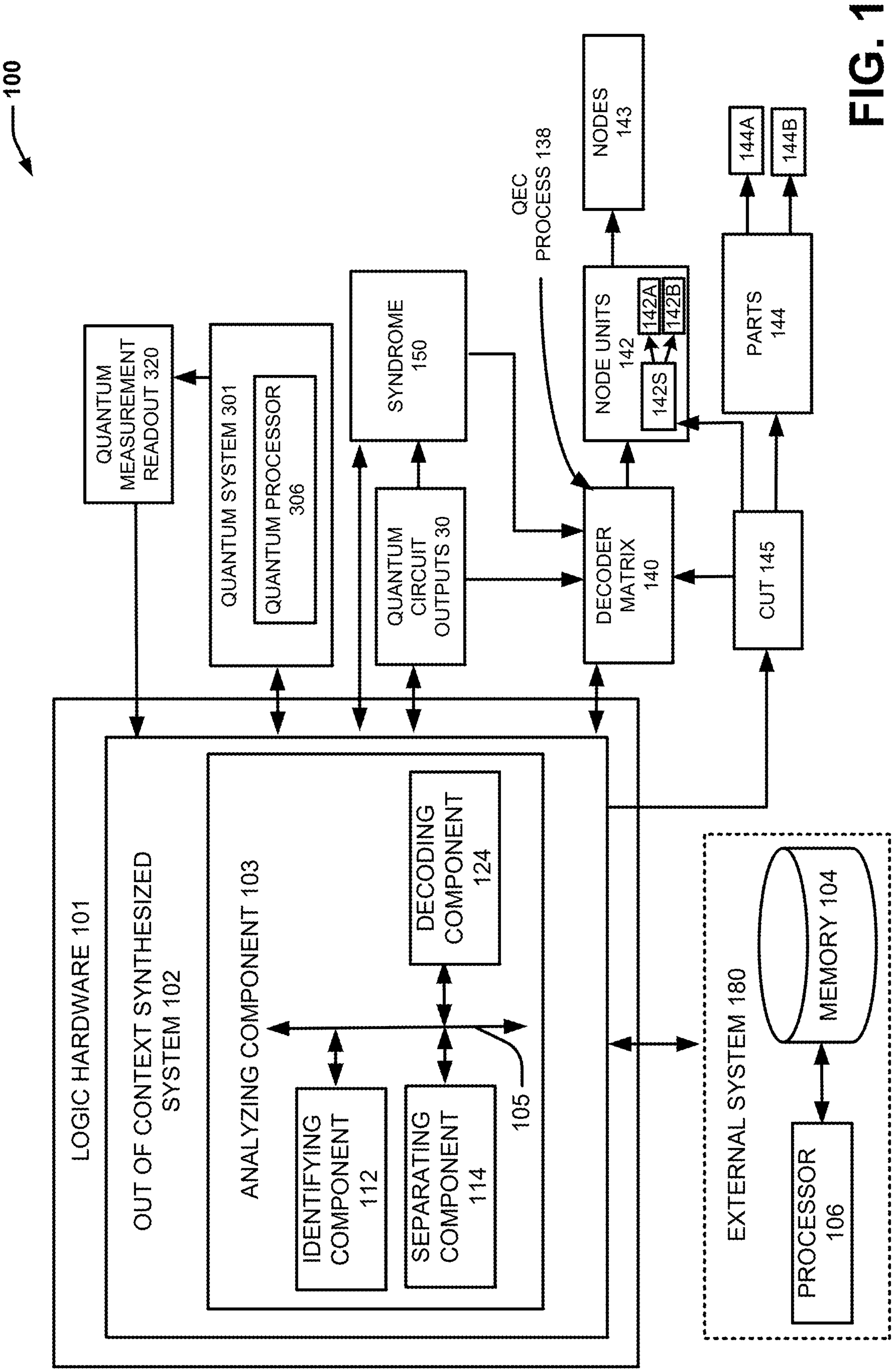
FIG. 1 illustrates a block diagram of an example, non-limiting system that can provide a process for belief propagation-based quantum error correction, in accordance with one or more embodiments described herein. It is noted shaded matrix cells are employed herein at figures for differentiating between the plurality of different types of matrix cells. In view of the dots and lines representing aspects of the matrix cells within the matrix cells, alternative usage of fill pattern would affect ability of the reader to understand the subject matter presented at these figures.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As a brief summary, in practice, operation of a quantum circuit at a quantum computer, can involve introduction of noise and/or other errors into the system. Noise can be inherently caused by operation of gates at the quantum computer and/or due to hardware and/or software frameworks employed. The noise can manifest as errors in quantum circuit outputs of the quantum computer, such as affecting accuracy and/or precision of such quantum circuit outputs as compared to an ideal quantum circuit output. In various cases, it can be possible to mitigate such errors to limit their occurrence and/or to correct for the errors by addressing the errors subsequent to their occurrence. This latter process, referred to as quantum error correction, often can be based on an ability of logic, hardware and/or software to process a complex quantum circuit output, where different types of error can require different types of quantum error correction to address the different types of error.

One example of a quantum error correction process that can be employed is belief propagation. Belief propagation refers to a half-to-half network between compute units, e.g., check node units and variable node units, used to decode error correction codes. Generally, decoder matrices, such as represented by Tanner graphs, are employed with two types of nodes, check nodes and variable nodes, which form respective check node units of check nodes and variable node units of variable nodes. These node units (e.g., the check node units and variable node units) separately synthesize outputs, which are then communicated from check node units to variable node units and vice versa, after receipt of a syndrome by one or more of the node units. As used herein, a syndrome refers to data input into a quantum error correction process that represents the errors, such as based on external evaluation rather than in depth evaluation, of a quantum circuit output. Another input can be a collection of all prior probabilities related to the syndrome, e.g., a probability for each potential fault and/or condition that could have caused the syndrome.

Based on these inputs, a quantum error correction process, such as a belief propagation decoder, can make a diagnosis of the quantum circuit output, which diagnosis (e.g., decoded syndrome) can be employed to address, such as correct, one or more errors of a quantum circuit output.

Generally, a belief propagation decoder can be based on a decoder matrix which need not, but which can, be visualized. The decoder matrix, such as represented by a Tanner graph, provides a mapping of connectivities (e.g., a connectivity matrix) between node units of the decoder matrix. For example, a decoder matrix can be comprised of ad/or represent a set of check node units as the rows and a set of variable node units as the columns. The check node units comprise vectors of check nodes that correspond to information obtained from check qubits of a quantum system. The variable node units comprise vectors of variable nodes that correspond to information defining possibilities of causes of the syndrome.

Generally, check node units and variable node units separately perform information synthesis, with check node units passing synthesized information to variable node units and variable node units passing synthesized information to check node units. This can progress along a full decoder matrix, with a plurality of iterations of passing information back and forth iteratively until a convergence is reached. As used herein, a convergence can refer to an agreement on a syndrome between check node units and variable node units.

In one or more embodiments, this agreement can be prefaced on a convergence threshold, such as full convergence or any lesser quantity.

In existing frameworks for quantum error correction, a standard belief propagation method can be employed as described above. Such existing belief propagation methods often can be employed in gateware, field programmable gate arrays (FPGAs), and/or application-specific integrated circuits (ASICs). Belief propagation logic for gateware, FPGAs and/or ASICs can be developed in a hardware description language (HDL). The logic can comprise an automated step, called synthesis, which translates the description of an HDL into logic gates and connections between them. However, when a quantum error correction corresponds to a quantum execution employing tens of qubits, hundreds of qubits, or even greater quantities of qubits. This can result in use of decoder matrices comprising 100s of columns and 10s of rows, or even 1000s of columns and 100s of rows. Accordingly, complexity of the quantum circuits being employed can be too great for the synthesis tools that are existingly available. That is, a quantity of qubits employed and complexity of the decoder matrices to be used can be limiting factors that can cause existing synthesis frameworks to fail and/or fault. For example, a translation process for a decoder with a large decoder matrix can take days or even weeks, or such translation process can fail entirely due to one or more internal errors.

Put another way, operation of a quantum error correction method using belief propagation with check qubits numbering in the hundreds, such as due to taking samples at different phases in time and aggregating the samples, and/or with large quantum circuit outputs from large quantity qubit systems, as described above, can be too memory-intensive, and/or cannot scale well, causing the logic synthesis process of a belief propagation process to fault.

To account for the one or more deficiencies, one or more frameworks discovered by the inventors and discussed herein can be employed for reducing and/or avoiding such faults and indeed obtaining successful translation relative to some high complexity quantum circuit outputs (e.g., relative to a qubit system having a hundred or more qubits and/or relative to an aggregated quantity of check qubits numbering in the hundreds). This can be based on obtaining a description for a decoder matrix and associated synthesis results that can be implemented in an FPGA and/or ASIC, for example, without being limited thereto. As a result, error correction can be performed, such as at a classical system, with lower energy, power, bandwidth, memory, etc. requirements and/or with less manual labor.

Further, the one or more embodiments described herein can be employed at existing gateware, FPGA's etc., to allow for easy plug-and-play of the one or more embodiments described herein. In one or more cases, the one or more embodiments described herein can therefore be hardware agnostic.

Generally, the one or more embodiments described herein can employ out of context synthesis for discrete and/or repeating parts of a decoder matrix generated for a belief propagation process. That is, a part (e.g., a part of the decoder matrix) and its outputs can be addressed out of context of a remainder of the belief propagation framework, e.g., out of context of the remaining decoder matrix, such as represented as a Tanner graph.

As a result, the one or more embodiments described herein can reduce a vector of connections between nodes corresponding to the detector matrix that communicate with one another in series to result in one or more synthesized outputs. For example, instead of progressing through a vector of a full decoder matrix, as in existing frameworks, the one or more embodiments described herein can address discrete parts of the decoder matrix out of context from the remainder of the full decoder matrix. A part can be evaluated by using an assumption that connections to nodes upstream or downstream of the part have been cut at the decoder matrix, at least for the purpose of the out of context belief propagation synthesis of the part. Where parts are identified specifically as units that repeat at different locations of the decoder matrix, same output results can be employed for the repeat parts, significantly reducing the workload to synthesize the full decoder matrix and reducing data that is processed.

As used herein, the term "data" can comprise metadata.

As used herein, the terms "entity," "requesting entity," "user entity," and "administrating entity" can refer to a machine, device, component, hardware, software, smart device, party, organization, individual and/or human.

One or more embodiments are now described with reference to the drawings, where like referenced numerals are used to refer to like elements throughout. In the following description, for purposes of explanation, numerous specific details are set forth to provide a more thorough understanding of the one or more embodiments. It is evident in various cases, however, that the one or more embodiments can be practiced without these specific details.

Further, it should be appreciated that the embodiments depicted in one or more figures described herein are for illustration only, and as such, the architecture of embodiments is not limited to the systems, devices and/or components depicted therein, nor to any particular order, connection and/or coupling of systems, devices and/or components depicted therein.

Figure 2:
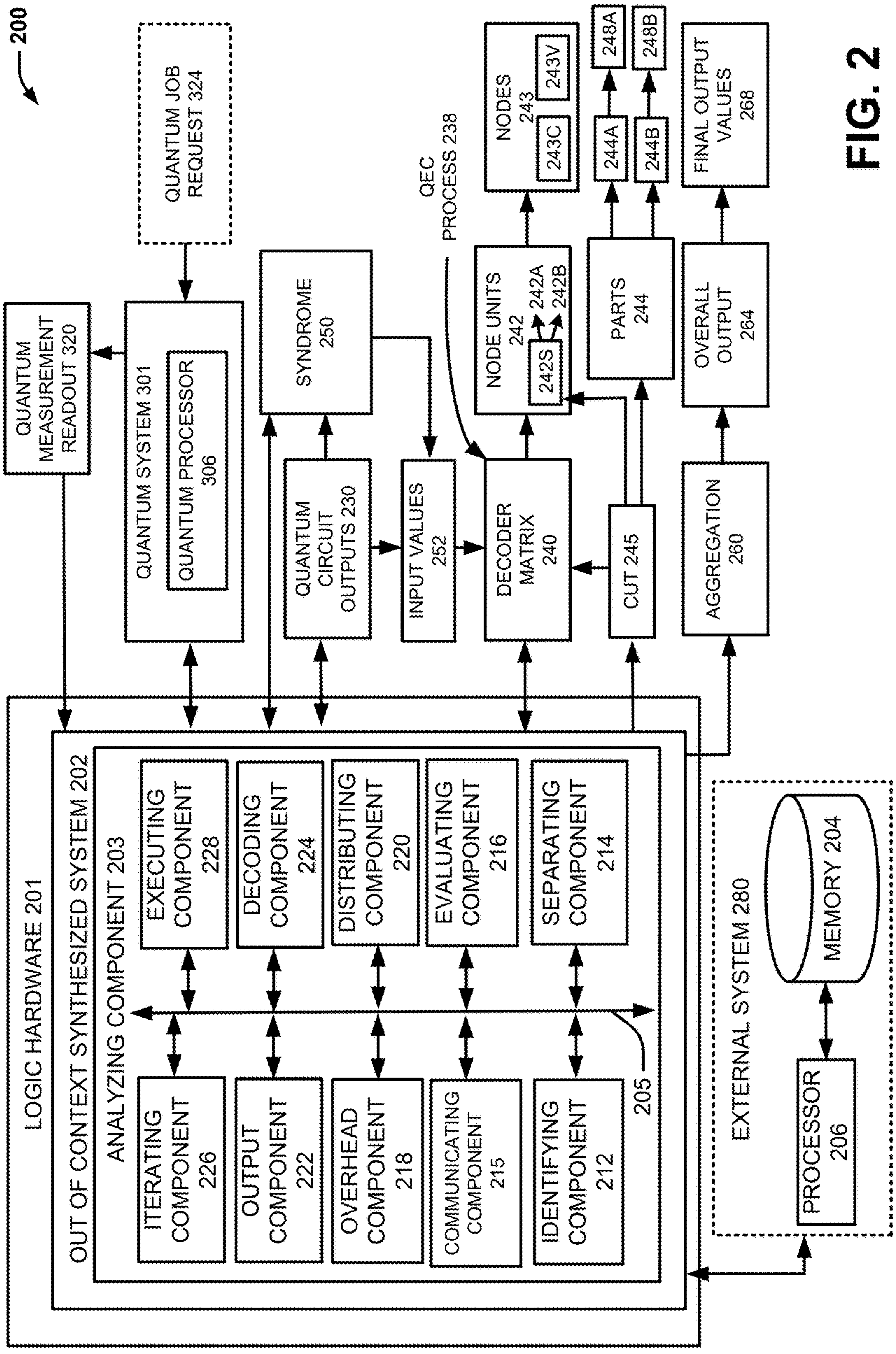
FIG. 2 illustrates a block diagram of another example, non-limiting system that can provide a process for belief propagation-based quantum error correction, in accordance with one or more embodiments described herein.
Figure 13:
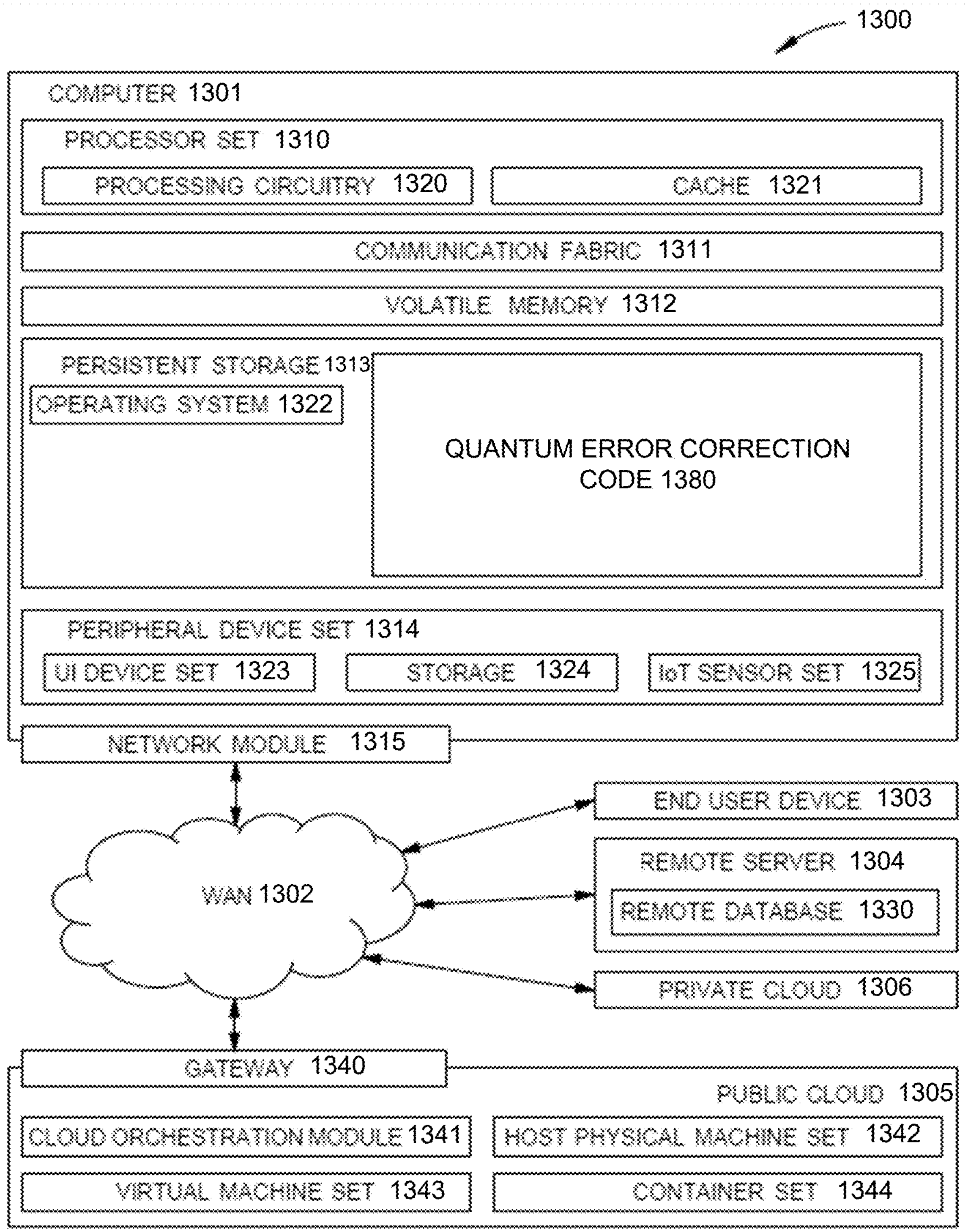
FIG. 13 illustrates a block diagram of an example, non-limiting, computer environment in accordance with one or more embodiments described herein.

For example, in one or more embodiments, the non-limiting systems 100 and/or 200 illustrated at FIGS. 1 and 2, and/or systems thereof, can further comprise one or more computer and/or computing-based elements described herein with reference to a computing environment, such as the computing environment 1300 illustrated at FIG. 13. In one or more described embodiments, computer and/or computing-based elements can be used in connection with implementing one or more of the systems, devices, components and/or computer-implemented operations shown and/or described in connection with FIGS. 1 and/or 2 and/or with one or more other figures described herein.

Figure 3:
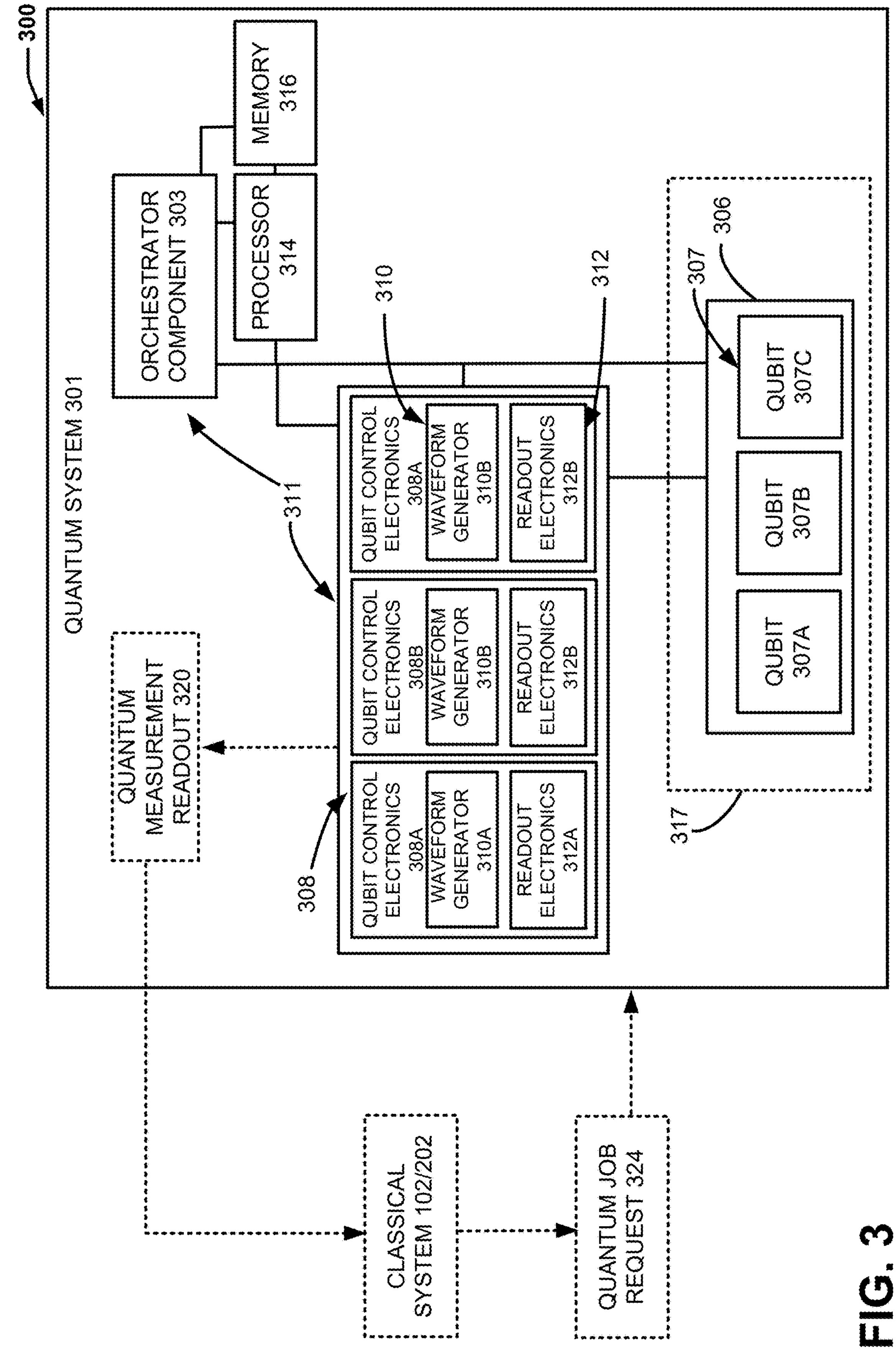
FIG. 3 illustrates a block diagram of a quantum system that can be employed in connection with the non-limiting systems of FIGS. 1 and 2, in accordance with one or more embodiments described herein.

Turning now in particular to one or more figures, and first to FIG. 1, the figure illustrates a block diagram of an example, non-limiting system 100 that can provide a process for belief propagation-based quantum error correction using both a classical out of context synthesized system 102 and a quantum system 301 (FIG. 3).

That is, the non-limiting system 100 can comprise the out of context synthesized system 102 and the quantum system 301, to be described in detail below. It is noted that the out of context synthesized system 102 is only briefly described relative to FIG. 1 to provide but a lead-in to description of a more complex and/or more expansive out of context synthesized system 202 as illustrated at FIG. 2. Further detail regarding processes that can be performed by one or more embodiments described herein will be provided below relative to the non-limiting system 200 of FIG. 2.

Still referring to FIG. 1, the out of context synthesized system 102 can be comprised by, comprise, employ and/or be employed by logic hardware 101 (e.g., a gateware, FPGA and/or ASIC). In one or more other embodiments, the out of context synthesized system 102 can be located external to, but still employed by, such logic hardware 101 (e.g., a gateware, FPGA and/or ASIC).

In one or more cases, a gateware and/or FPGA can comprise a processor 106. In one or more other embodiments, a gateware, FPGA and/or ASIC employing the out of context synthesized system 102 described herein can employ a processor 106 (e.g., for directing execution of one or more logic processes described herein) that is located external to the logic hardware 101 (e.g., gateware, FPGA and/or ASIC), e.g., at external system 180 external to the logic hardware being employed for facilitating a belief propagation process using out of context synthesis.

In one or more embodiments, a logic hardware 101 and/or out of context synthesized system 102 described herein can comprise and/or employ a memory 104. In one or more other embodiments, such memory 104 can be located external to the logic hardware 101 (e.g., gateware, FPGA and/or ASIC), e.g., at external system 180 external to the logic hardware being employed for facilitating a belief propagation process using out of context synthesis.

An external system 180 can be comprised by and/or external to the non-limiting system 100.

In one or more embodiments, a logic hardware 101 and/or out of context synthesized system 102 described herein can comprise a bus 105, such as comprising any communicative hardware, software, firmware and/or logic aspect allowing for communication amongst two or more aspects of the logic hardware 101 and/or out of context synthesized system 102.

In one or more embodiments, the out of context synthesized system 102 can be described as comprising an identifying component 112, separating component 114 and/or decoding component 124. It is appreciated that such components can be non-tangible and that the term "component" can be employed to describe one or more aspects of a logic hardware 101 that can perform the one or more function described herein as being able to be performed by the one or more components. Using these components and one or more outputs from the quantum system 301 as input to the out of context synthesized system 102, the out of context synthesized system 102 can provide for generation of an out of context (OOC) output for use in decoding of the syndrome 150.

Generally, a user entity can identify at least a pair of parts 144 of a decoder matrix 140 of a quantum error correction process 138. These parts 144 can comprise elements of the decoder matrix 140 that are contiguous with one another. To identify these parts 144, the user entity can identify a cut 145 to be made across, though, and/or at a node unit 142 (e.g., a check node unit or a variable node unit) represented at the decoder matrix 140.

In one or more cases, an identifying component 112 can identify the decoder matrix 140 and/or the out of context synthesized system 102 can generate the decoder matrix 140, such as based on an instruction to perform a belief propagation-based quantum error correction process 138.

The separating component 114 can separate the decoder matrix 140, based on a communication, direction and/or instruction provided by a user entity (e.g., by use of a computer device communicatively couplable to the out of context synthesized system 102). That is, the separating component 114 can separate the decoder matrix 140, representing node units 142 of the quantum error correction process 138, into a first part 144A and a second part 144B, by executing a cut 145 through a selected node unit, of the node units 142S. The cut 145 can be based on the communication, direction and/or instruction provided by the user entity, and/or based on corresponding data and/or metadata identified by the identifying component 112. The cut 145 is intended to separate at least one node unit 142 (e.g., a check node unit or a variable node unit) into at least a pair of node unit parts 142A and 142B. Accordingly, a portion of the selected node unit 142 can correspond to each of the parts 144. For example, a first node unit part 142A can correspond to the first part 144A of the decoder matrix 140, and a second node unit part 142B can correspond to the second part 144B of the decoder matrix 140.

It is appreciated that the cut 145 can be non-permanent with respect to the decoder matrix 140. It is appreciated that the separation of the selected node unit 142S can be non-real, but rather facilitated by use of one or more markers, flags, etc. to delineate nodes connected to one node unit part 142A and other nodes connected to the other node unit part 142B.

The decoding component 124 can decode a syndrome 150 of the quantum error correction process 138 using an overall output of the parts 144, and thus also of the decoder matrix 140. More particularly, the decoding component 124 can decode the syndrome 150 by directing evaluation of the syndrome 150 by the first part 144A independent from evaluation of the syndrome 150 by the second part 144B.

In one or more embodiments, the identifying component 112, separating component 114 and/or decoding component 124 can be implemented independently, without the other of the identifying component 112, separating component 114 and/or decoding component 124. Additionally and/or alternatively, the identifying component 112, separating component 114 and/or decoding component 124 can be comprised by an analyzing component 103, the analyzing component 103 can perform one or more of the above-described functions of the identifying component 112, separating component 114 and/or decoding component 124, and/or the identifying component 112, separating component 114 and/or decoding component 124 can be omitted with the analyzing component 103 performing one or more of the above-described functions of the omitted identifying component 112, separating component 114 and/or decoding component 124.

In general, the non-limiting system 100 can employ any suitable method of communication (e.g., electronic, communicative, internet, infrared, fiber, etc.) to provide communication between the classical system 102 and the quantum system 301.

Figure 10:
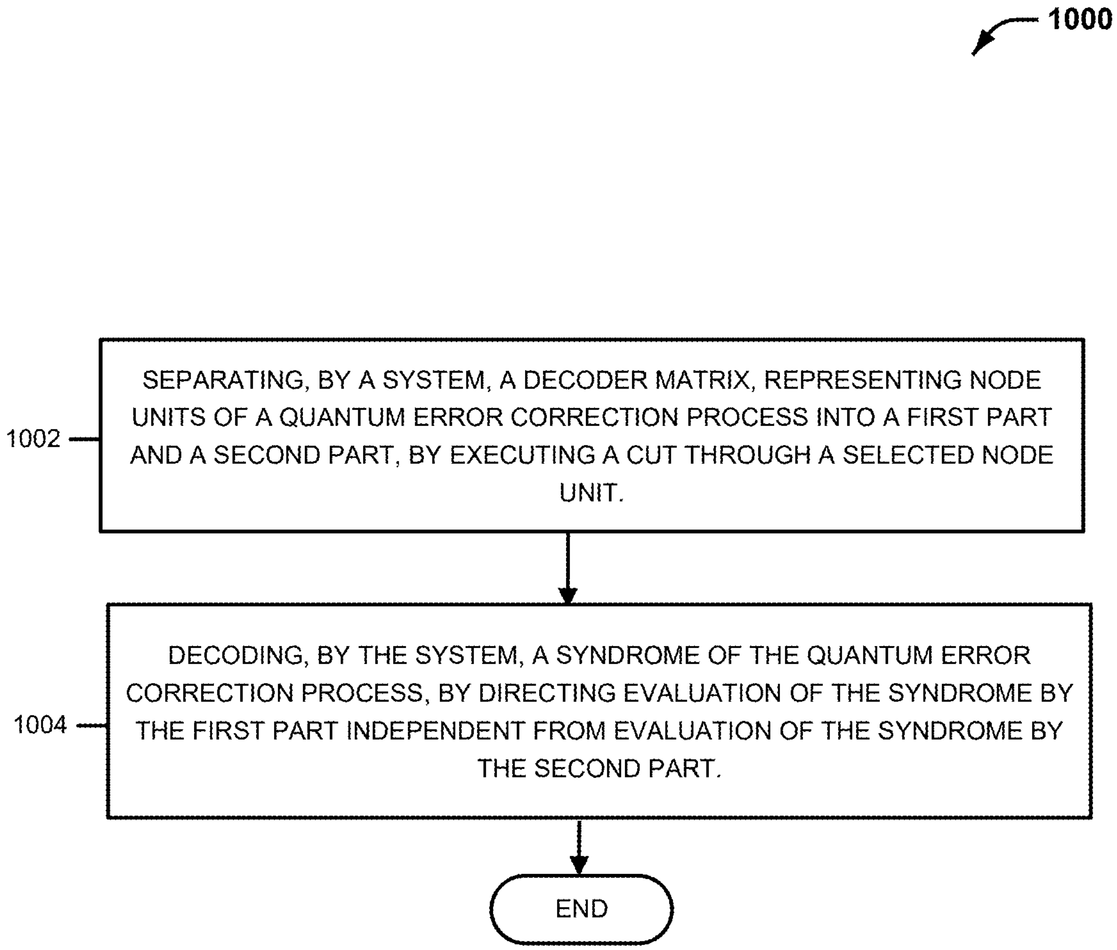
FIG. 10 illustrates a flow diagram of one or more processes that can be performed by the non-limiting system of FIG. 1, to provide a process for belief propagation-based quantum error correction, in accordance with one or more embodiments described herein.

As a summary, referring next briefly to FIG. 10, illustrated is a flow diagram of an example, non-limiting method 1000 that can provide a process for quantum error correction using a belief propagation method allowing for out of context synthesis, in accordance with one or more embodiments described herein, such as the non-limiting system 100 of FIG. 1. Repetitive description of like elements and/or processes employed in respective embodiments is omitted for sake of brevity.

At 1002, the non-limiting method 1000 can comprise splitting, by a system (e.g., separating component 114), a decoder matrix (e.g., decoder matrix 140), representing node units (e.g., node units 142) of a quantum error correction process (e.g., QEC process 138) into a first part (e.g., first part 144A) and a second part (e.g., 144B), by executing a cut (e.g., cut 145) through a selected node unit, of the node units (e.g., selected node unit 142) of the node units.

At 1004, the non-limiting method 1000 can comprise decoding, by the system (e.g., decoding component 124), a syndrome (e.g., syndrome 150) of the quantum error correction process, by directing evaluation of the syndrome by the first part independent from evaluation of the syndrome by the second part.

Turning next to FIG. 2, a non-limiting system 200 is illustrated that can comprise an out of context synthesized system 202. Repetitive description of like elements and/or processes employed in respective embodiments is omitted for sake of brevity. Description relative to an embodiment of FIG. 1 can be applicable to an embodiment of FIG. 2. Likewise, description relative to an embodiment of FIG. 2 can be applicable to an embodiment of FIG. 1.

Generally, the non-limiting system 200 can facilitate a process for belief propagation-based quantum error correction using both a classical out of context synthesized system 102 and a quantum system 301 (FIG. 3).

Turning first to the out of context synthesized system 202, one or more communications between one or more components of the non-limiting system 200 can be provided by wired and/or wireless means including, but not limited to, employing a cellular network, a wide area network (WAN) (e.g., the Internet), and/or a local area network (LAN). Suitable wired or wireless technologies for supporting the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2(3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an advanced and/or adaptive network technology (ANT), an ultra-wideband (UWB) standard protocol and/or other proprietary and/or non-proprietary communication protocols.

The out of context synthesized system 202 can be associated with, such as accessible via, a cloud computing environment.

The out of context synthesized system 202 can be comprised by, comprise, employ and/or be employed by logic hardware 201 (e.g., a gateware, FPGA and/or ASIC). In one or more other embodiments, the out of context synthesized system 202 can be located external to, but still employed by, such logic hardware 201 (e.g., a gateware, FPGA and/or ASIC).

The out of context synthesized system 202 can comprise a plurality of components. The components can comprise an identifying component 212, separating component 214, communicating component 215, evaluating component 216, overhead component 218, overhead component 218, output component 222, decoding component 224, iterating component 226 and/or executing component 228. It is appreciated that such components can be non-tangible and that the term "component" can be employed to describe one or more aspects of a logic hardware 201 that can perform the one or more function described herein as being able to be performed by the one or more components. Using these components, and using one or more outputs of operation of the quantum system 301, the non-limiting system 200 generally can provide one or more final output values 268 that can be employed by the out of context synthesized system 202 or another system to generate a decoding of a syndrome 250 corresponding to one or more errors at one or more quantum circuit outputs 230.

That is, the identifying component 212, separating component 214, communicating component 215, evaluating component 216, overhead component 218, overhead component 218, output component 222, decoding component 224, iterating component 226 and/or executing component 228 can operate at the classical system 202 of the non-limiting system 200. In one or more other embodiments, one or more processes performed by any one or more of the identifying component 212, separating component 214, communicating component 215, evaluating component 216, overhead component 218, overhead component 218, output component 222, decoding component 224, iterating component 226 and/or executing component 228 can be performed at the quantum system 301.

In one or more cases, a gateware and/or FPGA can comprise a processor 206. In one or more other embodiments, a gateware, FPGA and/or ASIC employing the out of context synthesized system 202 described herein can employ a processor 206 (e.g., for directing execution of one or more logic processes described herein) that is located external to the logic hardware 201 (e.g., gateware, FPGA and/or ASIC), e.g., at external system 280 external to the logic hardware being employed for facilitating a belief propagation process using out of context synthesis. A processor 206 can be and/or comprise a computer processing unit, microprocessor, classical processor, quantum processor and/or like processor.

An external system 280 can be comprised by and/or external to the non-limiting system 200.

In one or more embodiments, a component associated with the out of context synthesized system 202, as described herein with or without reference to the one or more figures of the one or more embodiments, can comprise one or more computer and/or machine readable, writable and/or executable components and/or instructions that can be executed by, and/or directed to be executed by, the processor 206 to provide performance of one or more processes defined by such component and/or instruction. In one or more embodiments, the processor 206 can comprise the identifying component 212, separating component 214, communicating component 215, evaluating component 216, overhead component 218, overhead component 218, output component 222, decoding component 224, iterating component 226 and/or executing component 228.

In one or more embodiments, a logic hardware 201 and/or out of context synthesized system 202 described herein can comprise and/or employ a memory 204. In one or more other embodiments, such memory 204 can be located external to the logic hardware 201 (e.g., gateware, FPGA and/or ASIC), e.g., at external system 280 external to the logic hardware being employed for facilitating a belief propagation process using out of context synthesis.

In one or more embodiments, the memory 204 can store computer-executable instructions that, upon execution by the processor 206, can cause the processor 206 and/or one or more other components of the out of context synthesized system 202 (e.g., identifying component 212, separating component 214, communicating component 215, evaluating component 216, overhead component 218, overhead component 218, output component 222, decoding component 224, iterating component 226 and/or executing component 228) to perform one or more actions.

Where the memory 204 is comprised by the out of context synthesized system 202, the memory 204 can store computer-executable components (e.g., identifying component 212, separating component 214, communicating component 215, evaluating component 216, overhead component 218, overhead component 218, output component 222, decoding component 224, iterating component 226 and/or executing component 228).

The out of context synthesized system 202 and/or any one or more components thereof as described herein, can be communicatively, electrically, operatively, optically and/or otherwise coupled to one another via a bus 205. Bus 205 can comprise one or more of a memory bus, memory controller, peripheral bus, external bus, local bus, quantum bus and/or another type of bus that can employ one or more bus architectures. One or more of these examples of bus 205 can be employed.

In one or more embodiments, the out of context synthesized system 202 can be coupled (e.g., communicatively, electrically, operatively, optically and/or like function) to one or more external systems (e.g., a non-illustrated electrical output production system, one or more output targets and/or an output target controller), sources and/or devices (e.g., classical and/or quantum computing devices, communication devices, external system 280, and/or like devices), such as via a network. In one or more embodiments, one or more of the components of the out of context synthesized system 202 and/or of the non-limiting system 200 can reside in the cloud, and/or can reside locally in a local computing environment (e.g., at a specified location).

In general, the non-limiting system 200 can employ any suitable method of communication (e.g., electronic, communicative, internet, infrared, fiber, etc.) to provide communication between the Out of context synthesized system 202 and the quantum system 301.

The out of context synthesized system 202 can comprise one or more computer and/or machine readable, writable and/or executable components and/or instructions that, when executed by processor 206, can provide performance of one or more operations defined by such component and/or instruction.

Discussion next turns to the additional components of the out of context synthesized system 202 (e.g., identifying component 212, separating component 214, communicating component 215, evaluating component 216, overhead component 218, overhead component 218, output component 222, decoding component 224, iterating component 226 and/or executing component 228).

First, it is noted that in one or more embodiments, the identifying component 212, separating component 214, communicating component 215, evaluating component 216, overhead component 218, overhead component 218, output component 222, decoding component 224, iterating component 226 and/or executing component 228 can be implemented independently, without one or more other of the identifying component 212, separating component 214, communicating component 215, evaluating component 216, overhead component 218, overhead component 218, output component 222, decoding component 224, iterating component 226 and/or executing component 228. Additionally and/or alternatively, the identifying component 212, separating component 214, communicating component 215, evaluating component 216, overhead component 218, overhead component 218, output component 222, decoding component 224, iterating component 226 and/or executing component 228 can be comprised by a analyzing component 203, one or more of the below-described functions of the identifying component 212, separating component 214, communicating component 215, evaluating component 216, overhead component 218, overhead component 218, output component 222, decoding component 224, iterating component 226 and/or executing component 228 can be performed by the analyzing component 203, and/or the identifying component 212, separating component 214, communicating component 215, evaluating component 216, overhead component 218, overhead component 218, output component 222, decoding component 224, iterating component 226 and/or executing component 228 can be omitted with the analyzing component 203 performing one or more of the below-described functions of the one or more omitted identifying component 212, separating component 214, communicating component 215, evaluating component 216, overhead component 218, overhead component 218, output component 222, decoding component 224, iterating component 226 and/or executing component 228.

Turning now to the identifying component 212, this component can generally find, locate, select, receive, download, upload and/or otherwise obtain information (e.g., data and/or metadata) defining parts 244 and/or a cut 145 to be executed by the separating component 214 relative to a decoder matrix 240 to result in two or more discrete parts 244 of a decoder matrix 240 of a quantum error correction process 238. In one or more cases, a user entity can transmit such information using a computer device that is communicatively couplable to the out of context synthesized system 202.

Additionally, and/or alternatively, the identifying component 212 can identify the decoder matrix 240. It is appreciated that the decoder matrix 240 can be in any suitable format (e.g., matrix, code, list, vectors, etc.) The decoder matrix 240 need not be illustrated for use by a user entity, as partially illustrated at FIG. 5. However, in one or more embodiments, the out of context synthesized system 202 (e.g., the processor 206) can provide the decoder matrix 240 as an illustration, such as at a GUI associated with, comprised by and/or communicatively coupled to the out of context synthesized system 202.

It is noted that in one or more cases, the out of context synthesized system 202 (e.g., processor 206) can have previously generated the decoder matrix 240, such as based on an instruction to perform a belief propagation-based quantum error correction process 238 (e.g., based on a quantum job request 324 sent to the non-limiting system 200). Additionally, and/or alternatively, the decoder matrix 240 can be received from any other suitable system, processor, application, etc. that is communicatively coupled to the out of context synthesized system 202.

Figure 5:
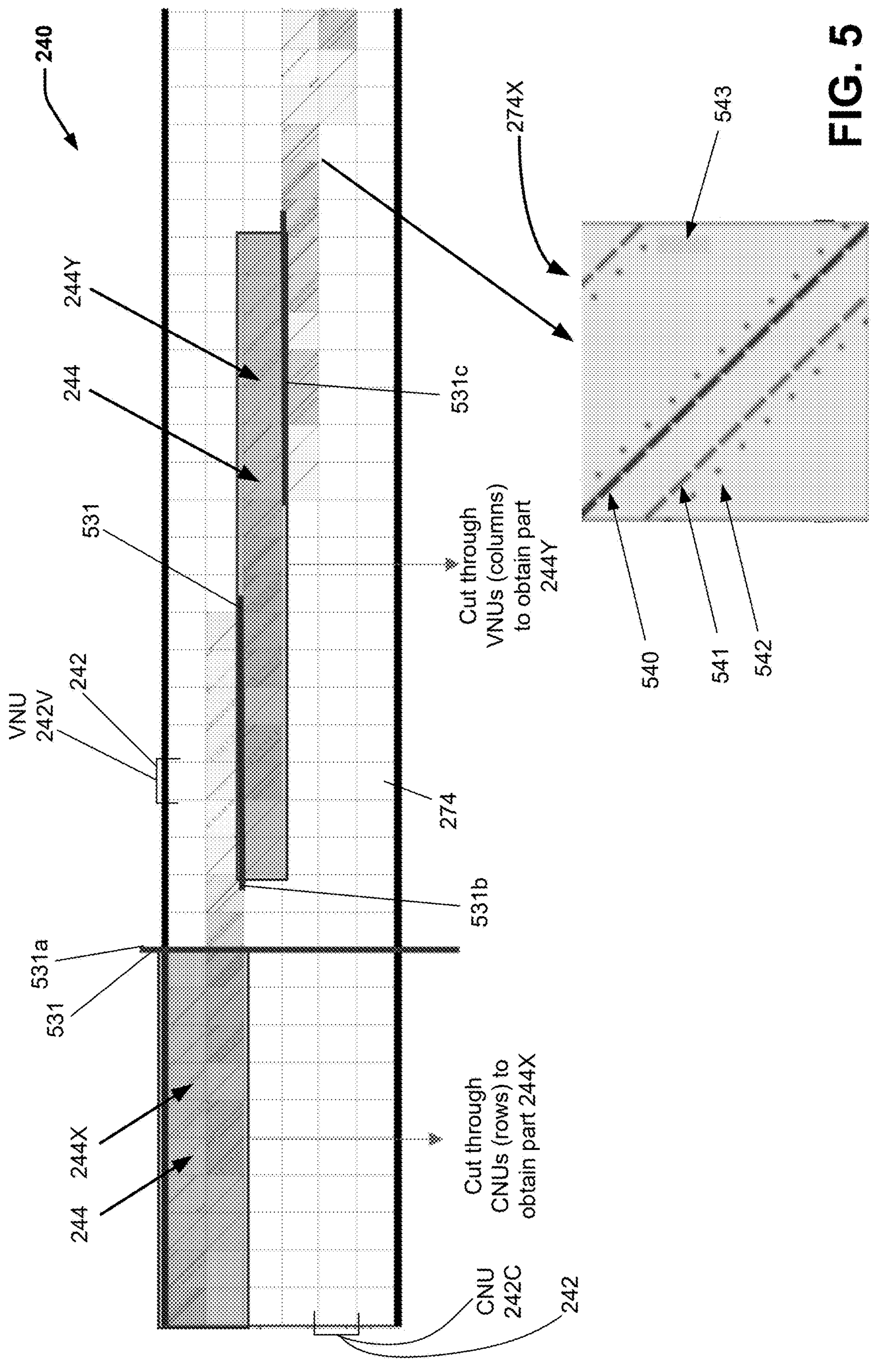
FIG. 5 provides a partial view of a decoder matrix visualizing a portion of a belief propagation process as can be employed by the embodiment of FIG. 2, in accordance with one or more embodiments described herein.

Turning next briefly to FIG. 5, and still referring to FIG. 2, various aspects of the example decoder matrix 240 are described to provide for understanding of terminology for description of processes that will follow.

That is, at FIG. 5, illustrated is a partial decoder matrix 240. It is appreciated that a full decoder matrix 240 can be larger (e.g., extending to the left, right, top and/or bottom along the page) depending on a quantity of inputs, and thus nodes, employed and/or represented by the decoder matrix 240. The decoder matrix 240 can comprise and/or represent a plurality of node units 242 (e.g., check node units and/or variable node units) representing the rows and columns of the decoder matrix 240. Each column with populated cells can represent a different variable node unit 242V, and each row with populated cells can represent a different check node unit 242C. That is, a belief propagation process employs vectors of check nodes 243C referred to as check node units 242C and vectors of variable nodes 243V referred to as variable node units 242V.

In one or more cases, a decoder matrix 240 can be and/or comprise a sparse matrix with only some cells 274 being employed, typically along a diagonal. As illustrated at FIG. 5, there are many empty cells 274 of the decoder matrix 240 that are not represented by and/or connected to nodes 243.

Figure 4:
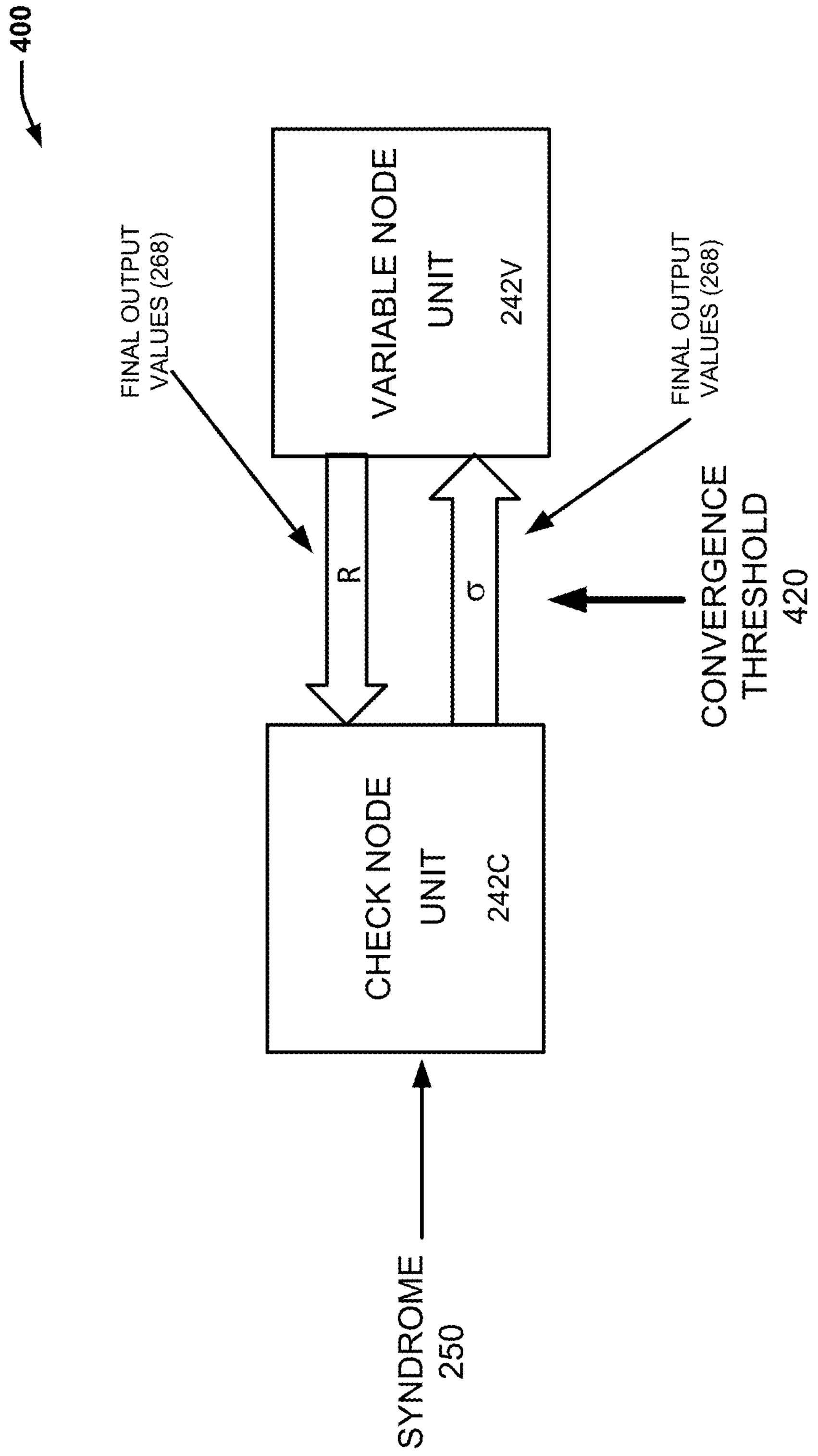
FIG. 4 provides a basic schematic flow diagram of belief propagation as employed by FIG. 2, in accordance with one or more embodiments described herein.

Generally, turning briefly to FIG. 4, the check node units (CNUs) 242C and the variable node units (VNUs) 242V can communicate back and forth (e.g., exchange communications) with one another through an iterative process, along the vectors of the decoder matrix 240, until a convergence on a syndrome 250 is reached. This process can be automatic and/or can be at least partially facilitated by the communicating component 215, for example, e.g., by directing the exchanging of communications.

Briefly, the syndrome 250, as described above and as used herein, is a definition of one or more errors of a quantum circuit output 230. The syndrome 250 can be received at one or more CNUs 242C, thus initiating the back and forth communication. To facilitate the communication, at least a portion of inputs of CNUs 242C can be connected to at least a portion of outputs of the VNUs 242V, and at least a portion of inputs of the VNUs 242V can be connected to at least a portion of outputs of the CNUs 242C.

Referring still to FIGS. 2 and 5, a node 243 (e.g., whether a check node 243C or a variable node 243V) can comprise information related to output of check qubits of a quantum system and/or to possibilities of causes of the syndrome 250. It is appreciated that a node cell 274 can correspond to one or more nodes 243 at the decoder matrix 240. A cell 274 can be part of both a row and a column and thus can represent portions of both a respective check node unit 242C and portions of a respective variable node unit 242V. That is, a vector or subvector of a check node unit 242C can comprise information based on outputs of check qubits of a quantum system (e.g., quantum system 301) which output a quantum circuit output 230 being quantum error corrected by the non-limiting system 200. One check node 243C can correspond to one flag of a check qubit. A vector or subvector of a variable node unit 242V can comprise variables defining probabilities of various causes of the syndrome 250, which can correspond to a vector of all flags from different time phases of operation of a quantum circuit. Accordingly, put another way, a decoder matrix 240 can represent a layout of error causation probabilities mapped against check qubit flags (e.g., representing errors for a quantum circuit output 230).

Figure 7A:
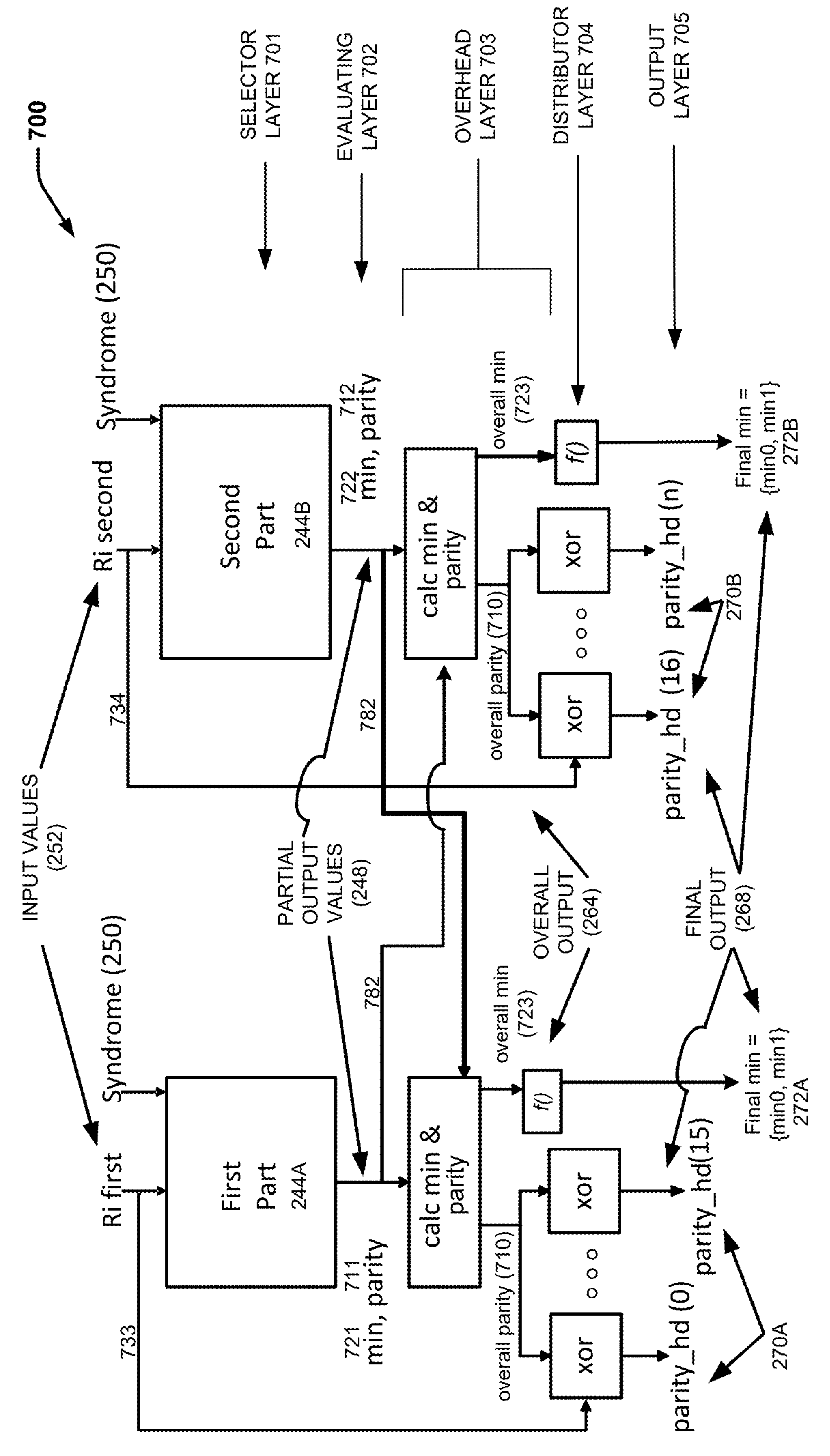
FIG. 7A provides a partial schematic diagram of logic processes that can be performed by the embodiment of FIG. 2 in correspondence with the pair of parts illustrated at FIG. 6, in accordance with one or more embodiments described herein.

Next, prior to further discussion of separating of the decoder matrix 240 into two or more parts 244 (e.g., as illustrated at FIGS. 7A and 9), direction first turns to the quantum system of FIG. 3, based upon and/or from which the variables, syndrome 250 and/or quantum circuit output 230 can have been generally obtained.

Turning to FIG. 3, one or more embodiments described herein can include one or more devices, systems and/or apparatuses that can provide a process to generate one or more waveforms or pulses for a quantum-based operation (e.g., using a quantum device), such as for operating one or more qubits of a quantum device. Accordingly, at FIG. 3, illustrated is a block diagram of an example, non-limiting system 300 that can at least partially facilitate such a process. While referring here to one or more processes, facilitations and/or uses of the non-limiting system 200, description provided herein, both above and below, also can be relevant to one or more other non-limiting systems described herein, such as the non-limiting systems 100 and/or 200.

As illustrated at FIG. 2, the non-limiting system 200 can comprise a quantum system 301 that can be employed with the classical systems 102/202 or separate from the classical systems 102/202. For example, as described above, one or more quantum circuit outputs 230 can be obtained and/or generated by the out of context synthesized system 202 (e.g., by the processor 206) based on one or more quantum measurement readouts 320 from the quantum system 301, where the one or more quantum measurement readouts 320 have one or more errors for quantum error correcting to be executed.

Generally, the quantum system 301 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high-level components and/or functions. The quantum circuity can generate physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement readouts 320, can be responsive to a quantum job request 324 and associated input data, which can be based at least in part on the input data, quantum functions and/or quantum computations.

In one or more embodiments, the quantum system 301 can comprise components, such as an orchestrator component 303, a quantum processor 306, pulse component (e.g., a waveform generator 310) and/or a readout electronics 312 (e.g., readout component).

The quantum processor 306 can comprise one or more, such as plural, qubits 307. Individual qubits 307A, 307B and 307C, for example, can be fixed frequency and/or single junction qubits, such as transmon qubits.

In one or more embodiments, a readout resonator can be associated with, such as located with physical hardware defining a qubit 307.

In one or more embodiments, a memory 316 and/or processor 314 can be associated with the orchestrator component 303, where suitable. The processor 314 can be any suitable processor. The processor 314 can generate one or more instructions for controlling the one or more processes of the orchestrator component 303, such as for controlling one or more subordinate controllers (e.g., qubit control electronics 308).

The orchestrator component 303 can obtain (e.g., download, receive, search for and/or the like) a quantum job request 324 requesting execution of one or more quantum programs and/or requesting a physical qubit layout. The quantum job request 324 can be provided in any suitable format, such as a text format, binary format and/or another suitable format. In one or more embodiments, the quantum job request 324 can be obtained by a component other than of the quantum system 301, such as a by a component of the classical systems 102/202.

The orchestrator component 303 can determine mapping of one or more quantum logic circuits for executing a quantum program based on the quantum job request 324. In one or more embodiments, the orchestrator component 303 and/or quantum processor 306 can control the waveform generator 310 to generate one or more pulses, tones, waveforms and/or the like to affect one or more qubits 307, such as in response to the quantum job request 324.

In one or more embodiments, more than one orchestrator component 303 can be comprised by the quantum system 301. The one or more orchestrator components 303 can be employed to control one or more qubit control electronics 308. Thus, the one or more qubit control electronics 308A, 308B and/or 308C can be communicatively coupled to the one or more orchestrator components 303.

Qubit control electronics 308 can be employed by the quantum processor 306 and disposed within a room temperature environment external to the cryogenic environment 317, as illustrated. In one or more embodiments, one or more aspects of one or more qubit control electronics can be disposed within a cryogenic environment 317.

In one or more embodiments a qubit control electronics 308 can be provided per qubit 307. In one or more embodiments, a qubit control electronics 308 can be provided to communicate with more than one qubit 307 per that qubit control electronics 308.

In one or more embodiments, a qubit control electronics 308 can be and/or can comprise a qubit drive card (e.g., a waveform generator 310) and/or a qubit acquire card (e.g., readout electronics 312). In one or more embodiments, a qubit control electronics 308 can be and/or can comprise only one of a qubit drive card or a qubit acquire card. In one or more embodiments, a qubit control electronics 308 can comprise more than one qubit drive card and/or more than one qubit acquire card.

A waveform generator 310 generally can cause at least one qubit 307 of the quantum processor 306 to perform one or more quantum processes, calculations and/or measurements by creating a suitable electro-magnetic signal. For example, the waveform generator 310 can operate one or more qubit effectors, such as qubit oscillators, harmonic oscillators, pulse generators and/or the like to cause one or more pulses to stimulate and/or manipulate the state(s) of the one or more qubits 307 comprised by the quantum system 301. Indeed, a signal can be generated by the waveform generator 310 to affect one or more of the plurality of qubits 307.

In one or more embodiments, the waveform generator 310 can control application of such electro-magnetic signal by use of the various qubit control electronics 308.

The quantum processor 306 can be contained in a cryogenic environment, such as generated by a cryogenic environment 317, such as effected by a dilution refrigerator. Where one or more of the plurality of qubits 307 are superconducting qubits, cryogenic temperatures, such as about 4K or lower, can be employed for function of these one or more physical qubits 307.

The readout electronics 312 can comprise and/or be comprised by the acquire card. The readout electronics 312 and/or the acquire card can comprise an analog to digital converter (ADC) 315 that can be employed for the readout path of one or more qubits 307. The readout electronics 312, or at least a portion thereof, can be contained in a room temperature environment or the cryogenic environment 317, such as for reading a state, frequency and/or other characteristic of qubit, excited, decaying or otherwise. Accordingly, one or more elements of the readout electronics 312 also can be constructed to perform at such cryogenic temperatures.

In one or more embodiments, more than one cryogenic environment, such as more than one dilution refrigerator, can be comprised by the quantum system 301.

It is noted that one or more aspects of the aforementioned description can refer to operation of a single set of instructions run on a single qubit controller or set of qubit control electronics. However, scaling can be achieved. For example, instructions can be calculated, transmitted, employed and/or otherwise used relative to one or more qubits (e.g., non-neighbor qubits) in parallel with one another, one or more quantum circuits in parallel with one another, and/or one or more qubit mappings in parallel with one another.

Turning back to FIG. 5, an illustration of a cell 274X at an illustrated decoder matrix 240 (e.g., represented by a Tanner graph) can comprise a set of dots 542 and dashes 540, 541 and 543. These dots and dashes can represent connections of the nodes 243 to one or more other nodes 243 and/or node units 242. For example, a check node 243C can implement equations of a row in the decoder matrix. As such, the dots 542 of cells 274 of one row can depict inputs to one specific CNU 242C. For another example, a variable node 243V can implement an equation of a column in the decoder matrix 240. As such, the dots 542 of cells 274 of one column can depict inputs to a specific VNU 242V.

As also illustrated at FIG. 5, a pair of parts 244 have been discretely separated from the decoder matrix 240 by the separating component 214, by applying cuts 531 (also referred to by 245 at FIG. 2). As illustrated, a part 244 can comprise one or more nodes 243C from one or more CNUs 242C and/or one or more nodes 243V from one or more VNUs 242V.

One part 244X (e.g., highlighted at FIG. 5) is identified as comprising a plurality of VNUs 242V and portions of a plurality of CNUs 242C. The cut line 531*a* is executed the CNUs 242C, cutting only a portion of the CNUs 242C represented at the decoder matrix 240.

A different part 244Y (e.g., highlighted at FIG. 5) is identified as comprising of a set of CNUs 242C and portions of a set of VNUs 242V. The cut line 531*b* is executed at a VNU 242V.

It is noted that both parts 244X and 244Y would not be employed in parallel for a same decoder matrix 240. Rather, a user entity would select, and a separating component 214 would separate by splitting CNUs (cutting vertically between columns and maintaining VNUs) or alternatively by splitting VNUs (cutting horizontally between rows and maintaining CNUs), but not both in parallel for a same process 238. Different processes 238 (one process 238 splitting CNUs 242C and one process 238 splitting VNUs 242V) could be performed for the same decoder matrix 240, in other embodiments.

Figure 6:
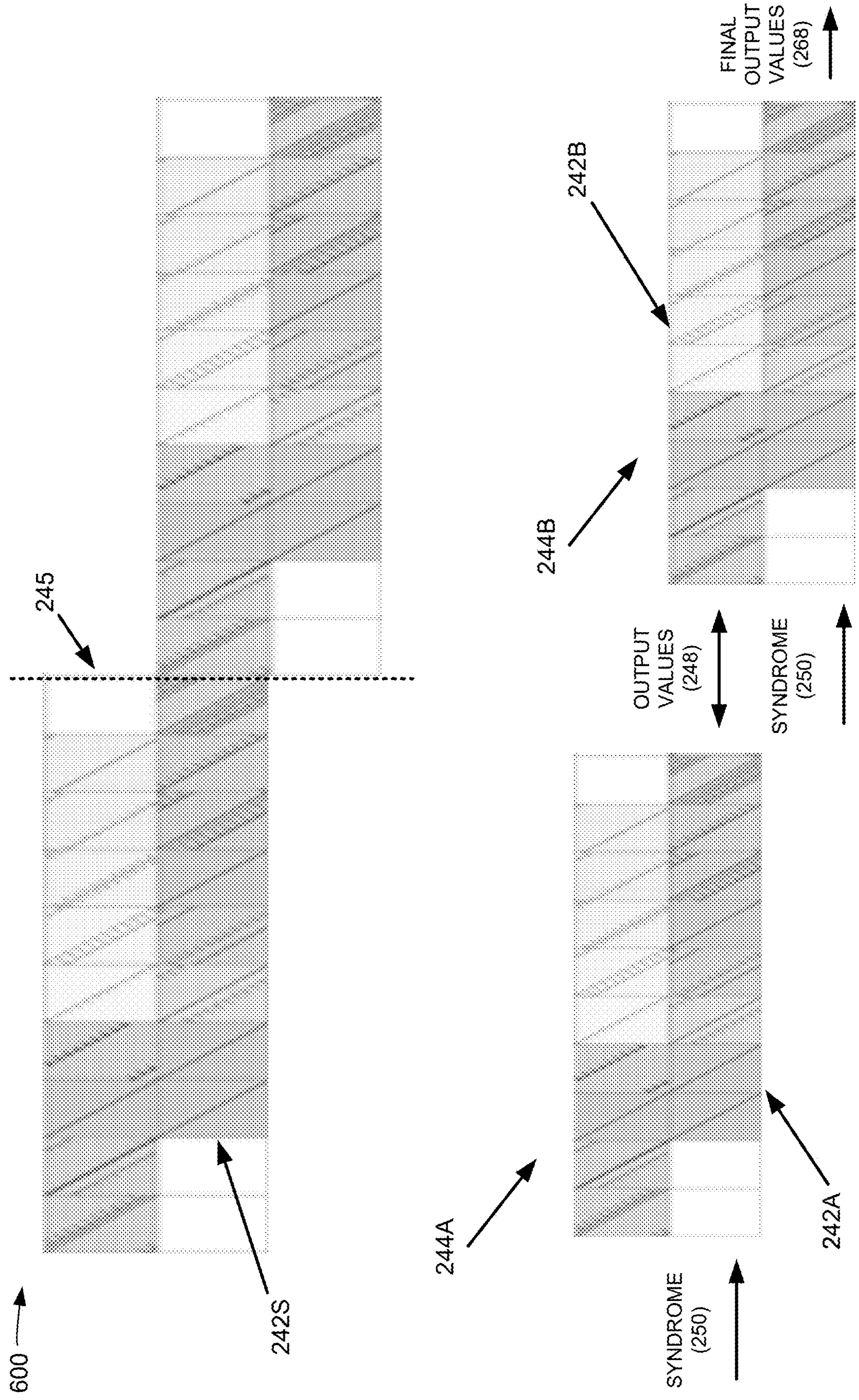
FIG. 6 provides a view of a pair of parts out of context of the partial decoder matrix illustrated at FIG. 5, in accordance with one or more embodiments described herein.

Referring still to FIG. 2 and now also to FIG. 6, another example of the separating of a decoder matrix 600 is illustrated (notably a brief and shorter decoder matrix for purposes of explanation here). A cut line 245 is executed by the separating component 214 at a CNU 242C, separating the selected CNU 242S (selected node unit 242S) into a first CNU part 242A and a second CNU part 242B. The cut line 245 can be identified by the separating component 214 and/or identifying component 212 based on the information identified by the identifying component 212. That is, the cut line 245 can be selected external to the out of context synthesized system 202, such as by a user entity.

Because the CNU 242S is separated by the separating component 214, the decoder matrix 600 also is separated at the same cut line 245, resulting in a first part 244A and a second part 244B. The first part 244A comprises the first CNU part 242A, and the second part 244B comprises the second CNU part 242B. As indicated above, it is noted that the separation at the cut line 245 can be theoretical and not actual, and/or non-permanent, such as where one or more flags or markers are employed by the separating component 214 to delineate the CNU parts and decoder matrix parts from one another.

Referring now also to FIG. 7A, and also still to FIG. 6, illustrated is a schematic illustration 700 of a logic process that can be employed by the out of context synthesized system 202 for performing out of context (OOC) synthesis for the decoder matrix 600 (notably a brief and shorter decoder matrix for purposes of explanation here) and more particularly, for OOC synthesis of the first part 244A and the second part 244B.

Generally, the logic process of FIG. 7A comprises a set of input values 252, a selector layer 701, evaluating layer 702, overhead layer 703, distributor layer 704 and output layer 705.

The input values 252 (e.g., $R_i$ first and $R_i$ second) to the selector layer 701 represent variable values received from a VNU 242V of the decoder matrix 600. More particularly, $R_i$ first and $R_i$ second can represent absolute variables of probability values (e.g., from negative infinity to positive infinity) of a set of variable nodes 243V of one or more VNUs 242V connected to the respective first part 244A or second part 244B.

At the evaluating layer 702, the evaluating component 216 can identify various output values 248. For example, the evaluating component 216 can identify a pair minimum values 721 for the first part 244A and a pair of minimum values 722 for the second part 244B. A pair of minimum values 721 or 722 can comprise a smallest input value and a second smallest input value.

The evaluating component 216 also can calculate a parity 711 for the first part 244A and a parity 712 for the second part 244B, using HD(Ri) of each part, respectively. The first parity value 711 can be and/or correspond to an exclusive or value (XOR) of bits of nodes (e.g., variable nodes 243V) connected to the first part 244A, and a second parity value 712, can be an XOR of bits of nodes (e.g., variable nodes 243V) connected to the second part 244B.

A set of partial output values 248 are therefore selected by the evaluating component 216 for the first part 244A and another set of partial output values 248 are selected by the evaluating component 216 for the second part 244B. The identified first parity value 711 and first minimum probability values 721 are first partial output values 248A. The identified second parity value 712 and second minimum probability values 722 are second partial output values 248B.

Figure 7B:
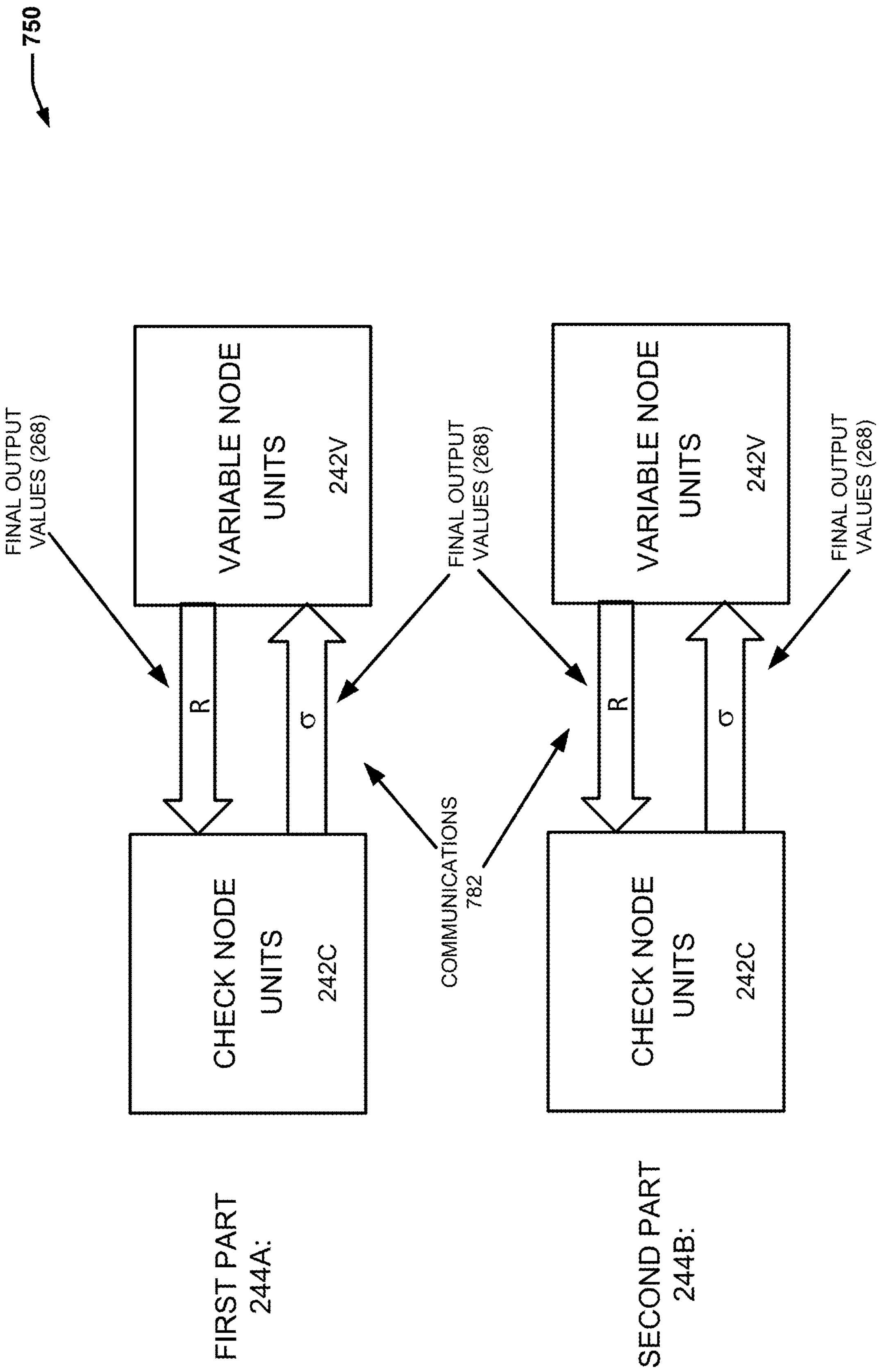
FIG. 7B provides a basic schematic flow diagram of belief propagation as employed by FIG. 2, in connection with FIG. 7A, and in accordance with one or more embodiments described herein.

Turning briefly to FIG. 7B, between the evaluating layer 702 and the overhead layer 703, the communicating component 215 can direct communication 782 of the partial outputs 248 of each of the parts 244 of the decoder matrix 600 to each other of the parts 244 of the decoder matrix 600. That is, all-to-all communication can be executed based on directing by the communicating component 215. For example, communication is from 244A to 244B and from 244B to 244A.

Were there three parts 244A, 244B and 244C (not specifically shown), all-to-all communication would require communication from 244A to 244B, from 244A to 244C, from 244B to 244A, from 244B to 244C, from 244C to 244A, and from 244C to 244B.

Turning back now to FIG. 7A, at the overhead layer 703, based on the partial output values 248 (e.g., the values 711, 712, 721 and 722), the overhead component 218 can generate an aggregation 260 by combining the first minimum probability values 721 of the first part 244A with the second minimum probability values 722 from the second part 244B, and by combining the first parity value 711 from the first part 244A with the second parity value 712 from the second part 244B. Put another way, this aggregation 260 can comprise a full set of minimum probability values and parity values from both the first part 244A and the second part 244B combined.

Also at the overhead layer 703, the overhead component 218 can determine an overall output 264 of the aggregation 260 of the first partial output 248A and the second partial output 248B by determining an overall parity 710 between the first parity value 711 from the first part 244A and the second parity value 712 from the second part 244B.

Also at the overhead layer 703, the overhead component 218 also can determine the overall output 264 of the aggregation 260 of the first partial output 248A and the second partial output 248B by determining overall minimum probability values 723 being the lowest minimum probability values of the first minimum probability values 721 and the second minimum probability values 722. For example, overall minimum probability values 723 can comprise a pair of values.

That is, the overall output 264 can comprise the overall parity 710 and the overall minimum probability values 723 for the full decoder matrix 600.

At the distributor layer 704, the pair of overall minimum probability values 723 can then be post-processed by a function f( ) as required, such as by the distributor component 220.

At the output layer 705, based on the overall parity 710 and overall minimum probability values 723, the output component 222 can generally evaluate final output probability values (e.g., final output values 268) based on the aggregation 260. A quantity of first final output probability values 268A for the first part 244A is based on (e.g., equal to) a quantity of connections between the first part 244A and nodes (e.g., variable nodes 243V) connected to the first part 244A. A quantity of second final output probability values 268B for the second part 244B is based on (e.g., equal to) a quantity of connections between the second part 244B and nodes (e.g., variable nodes 243V) connected to the second part 244B. This evaluation by the output component 222 can comprise calculating a final parity value by an XOR of the overall parity 710 with the input values 252. Also, this evaluation by the output component can result in scaling and/or filtering of the overall minima 723, for example.

As illustrated at FIG. 7A, a parity value can correspond to only one connection to a variable node 243V of the respective first part or second part 244A or 244B, with there being a maximum of 32 available connections, at least in one or more embodiments, without being limited thereto. It is noted that "hd" nomenclature at FIG. 7A refers to hard decision. As used herein, a hard decision decoding can refer to a process used in error correction coding where a decoder (e.g., decoding component) can make binary decisions regarding a received input based on whether the received input is closer to a 0 or a 1.

Further, comprised by the first final output probability values 268A, there can be a set of minimum values corresponding to the overall minimum probability values 723 and a set of sigma values corresponding to the overall parity value 710, while each parity value also corresponds to the particular input values to the first part 244A (see, e.g., line 733 at FIG. 7A). Likewise, comprised by the second final output probability values 268B, there can be a set of minimum values corresponding to the overall minimum probability values 723 and a set of parity values corresponding to the overall parity value 710, while each parity value also corresponds to the particular input values to the second part 244B (see, e.g., line 734 at FIG. 7A).

As illustrated at FIG. 6 and at FIG. 7B, the final output values 268 can be communicated to one or more VNUs 242V, to allow for the typical belief propagation (BP) iterative process illustrated at FIG. 4, as understood by one having ordinary skill in the art of belief propagation.

Figure 8:
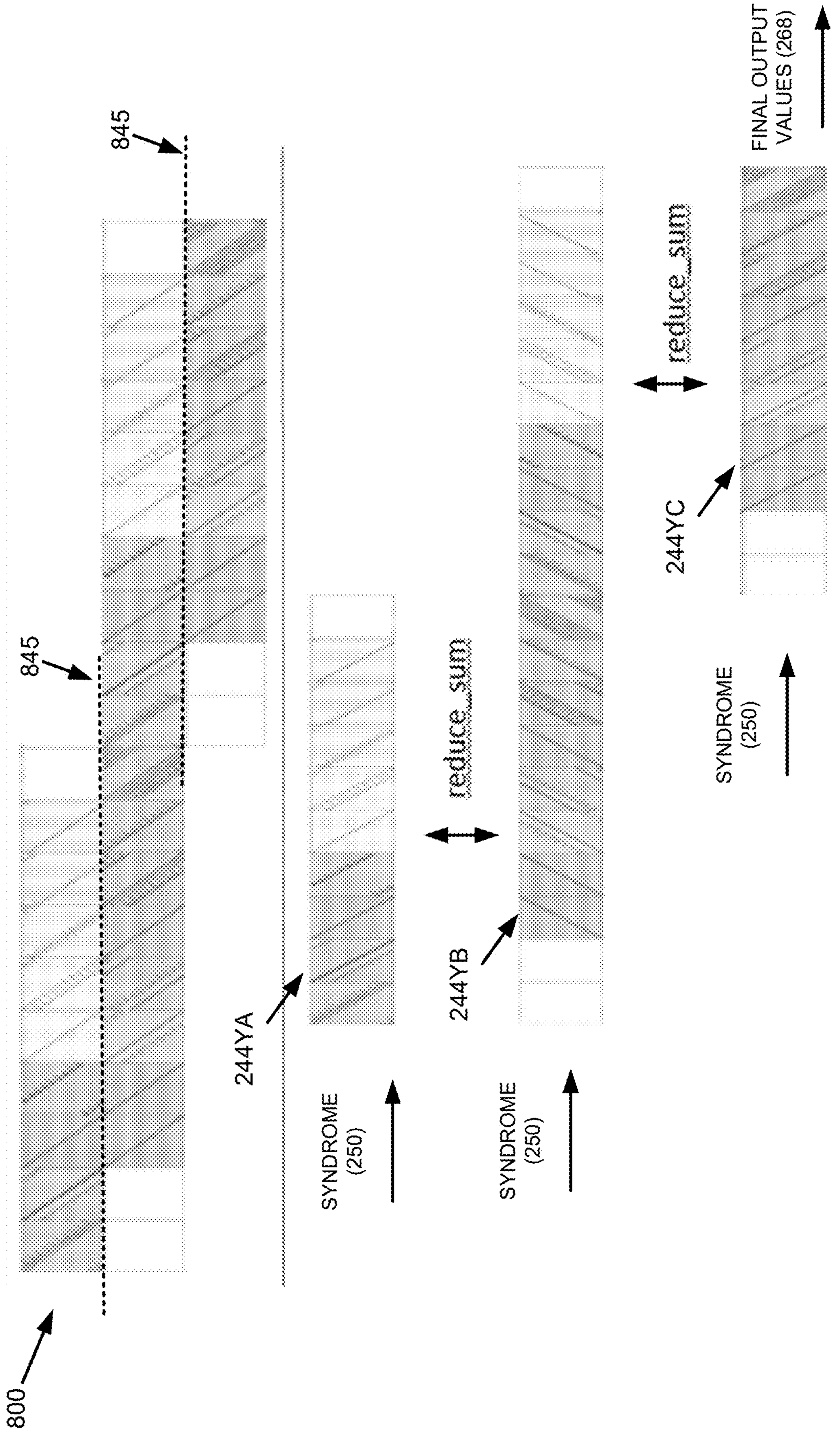
FIG. 8 provides a view of another set of parts out of context of the partial decoder matrix illustrated at FIG. 5, in accordance with one or more embodiments described herein.

Turning next to FIG. 8, the separating process (e.g., as performed by the separating component 214) differently can be performed by splitting/separating VNUs 242V instead of CNUs 242C. That is, multiple cut lines 845 can be employed per decoder matrix 800, at least partially in parallel with one another. For illustrative purposes, the decoder matrix 800 is separated into three different parts 244YA, 244YB, and 244YC. It is again noted that a decoder matrix can be split into any suitable quantity of parts, but that an increase in parts can correspond to an increase in time, power, memory and/or bandwidth employed for the out of context synthesis of that respective decoder matrix. This increase can be at least due to the all-to-all communication employed between the resulting plurality of different parts 244 (e.g., communications 702, 902).

It is noted that the first, second and third parts 244YA, 244YB and 244YC can each comprise and/or correspond to different VNU parts of the same VNUs in view of the respective cuts 845 having been executed by the separating component 214 at and/or through VNUs 242V.

Figure 9A:
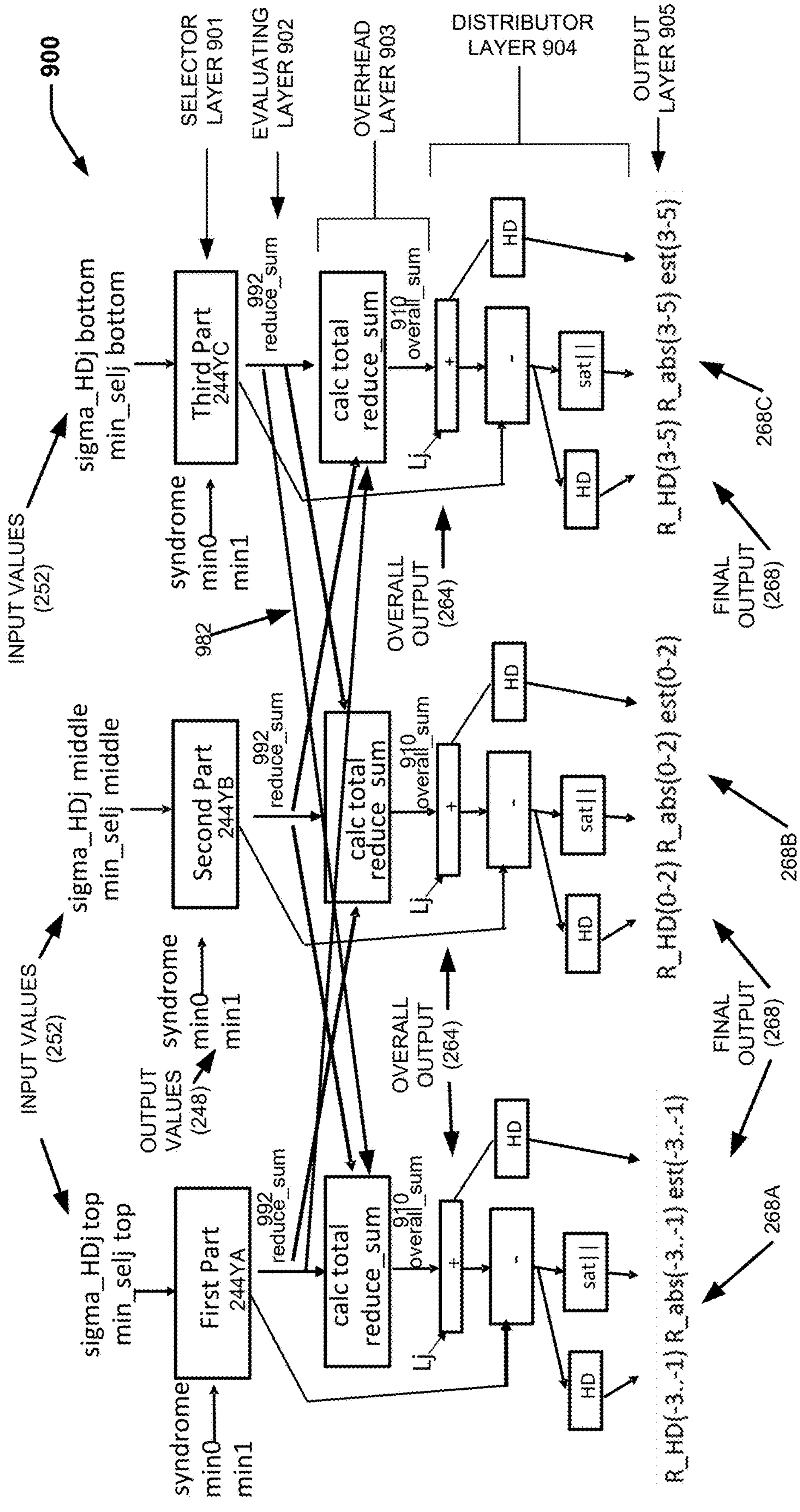
FIG. 9A provides a partial schematic diagram of logic processes that can be performed by the embodiment of FIG. 2 in correspondence with the set of parts illustrated at FIG. 8, in accordance with one or more embodiments described herein.

Referring now to FIG. 9A, and also still to FIG. 8, illustrated is a schematic illustration 900 of a logic process that can be employed by the out of context synthesized system 202 for performing out of context synthesis for the decoder matrix 800.

That is, similar to the logic process of FIG. 7A, the logic process of FIG. 9A comprises a set of input values 252, a selector layer 901, evaluating layer 902, overhead layer 903, distributor layer 904 and output layer 905. That is, similar to the processes described above as performed by the evaluating component 216, overhead component 218, communicating component 215, overhead component 218, distributing component 220 and output component 222 for the decoder matrix 600, these processes also can be performed for the decoder matrix 800.

Different from the logic process of FIG. 7A, at the logic process of FIG. 9A, the overhead component 218, at the overhead layer 902 can aggregate sums (labeled reduce_sum 992 at FIG. 9A) output from the partial VNUs 242YA through 242YC, instead of the minimum probability values and the parity values.

Figure 9B:
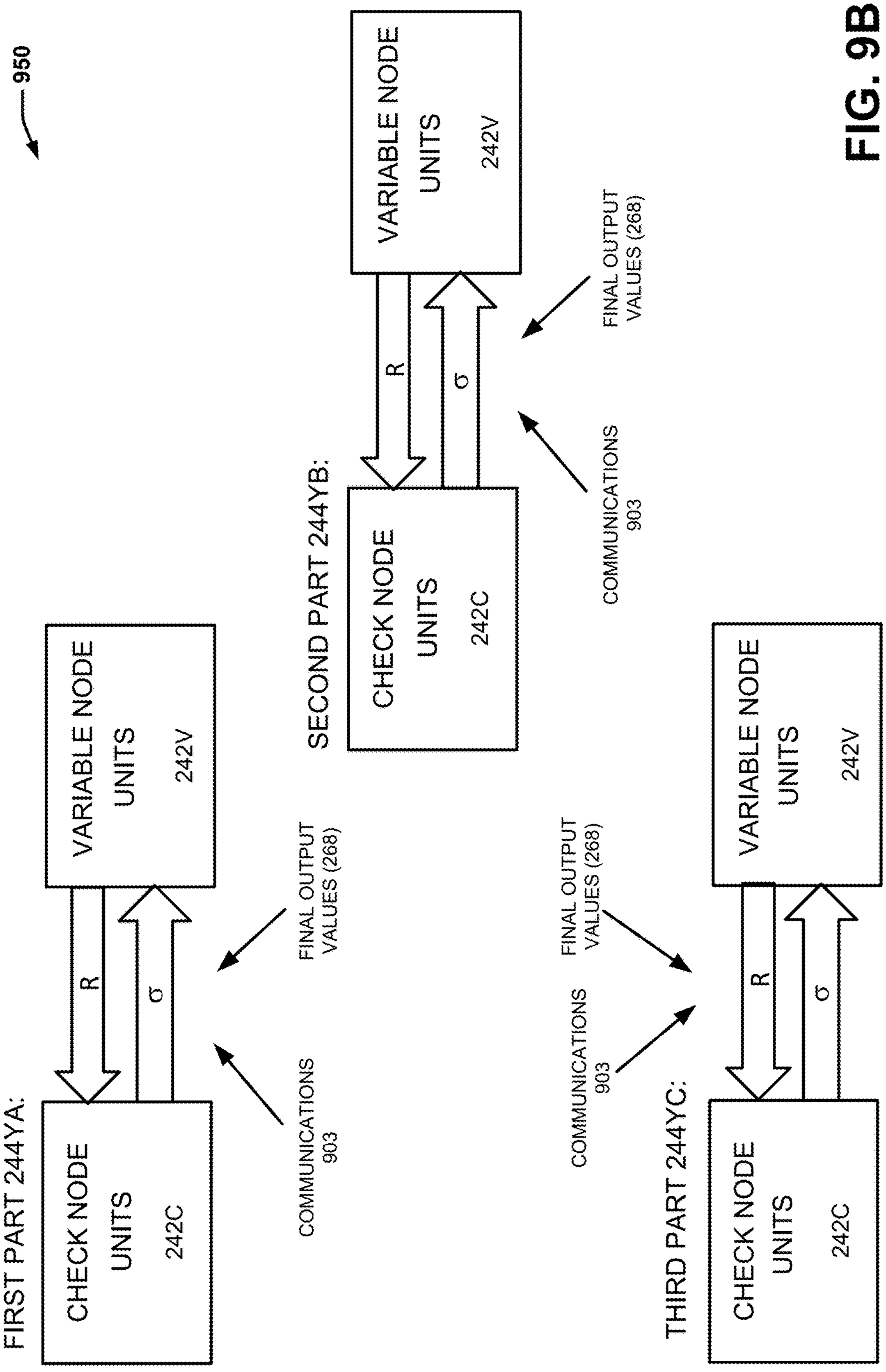
FIG. 9B provides a basic schematic flow diagram of belief propagation as employed by FIG. 2, in connection with FIG. 9B, and in accordance with one or more embodiments described herein.

This aggregation can be a result of direction by the communicating component 215 of exchange of communications between the partial VNUs 242Y (and thus between the parts 244Y) at communications 903. See, e.g., FIGS. 8 and 9B illustrating such communications 903.

As illustrated at FIG. 9A, as a result of the separating component 214, all-to-all communication between the resulting parts 244Y is employed at the logic process of FIG. 9. Communications 903 are all to all communications, and thus reduce_sums from each partial VNU 242Y is communicated to each other partial VNU 242Y. For example, communication is from 244YA to 244YB, from 244YA to 244YC, from 244YB to 244YA, from 244YB to 244YC, from 244YC to 244YA, and from 244YC to 244YB.

Turning again to FIG. 2 and also to FIG. 5, the decoding component 224 can decode a syndrome 250 of the quantum error correction process 238 using an overall output 264 of the decoder matrix 240 (e.g., decoder matrix 600), the overall output 264 being based on an aggregation 260 of a first output 248A of the first part 246A and a second output 248B of the second part 246B. In one or more cases, each of the first output 248A and the second output 248B can comprise at least one parity value and at least one minimum probability value. The overall output 264 can, in one or more cases, comprise at least a parity value and one or minimum probability values of the parity values and minimum probability values of the first output 248A and/or second output 248B.

The iterating component 226 can direct repetition of the decoding by the decoding component 224, comprising directing communication transfers between check node units 242C and variable node units 242V of the decoder matrix 240 until a convergence threshold 420 is satisfied. Each iteration can comprise use of the same parts 244 and respective parts 246. The convergence threshold 420 can be a full convergence or any lesser quantity. As noted above, a convergence can refer to agreement between CNUs 242C and VNUs 242V on the syndrome 250. It is noted that the VNUs 242V typically generate the respective estimate employed.

Finally, the executing component 228 can determine and/or output a cause of the syndrome 250 and/or provide one or more instructions for correcting one or more errors of the quantum circuit output 230 being address by the belief propagation-based quantum error correction process 238 described above.

Figure 11:
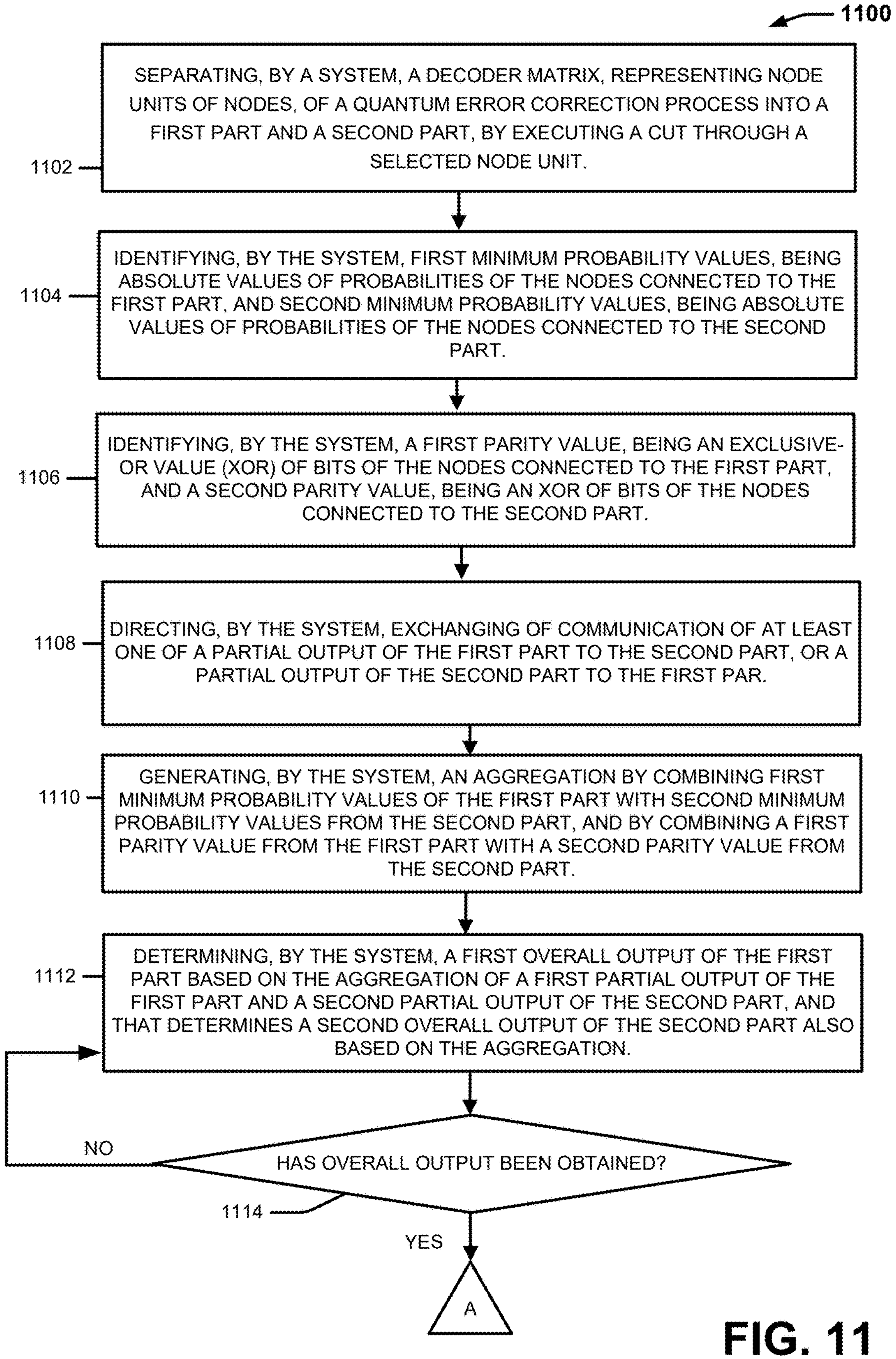
FIG. 11 illustrates a flow diagram of one or more processes that can be performed by the non-limiting system of FIG. 2, to provide a process for belief propagation-based quantum error correction, in accordance with one or more embodiments described herein.
Figure 12:
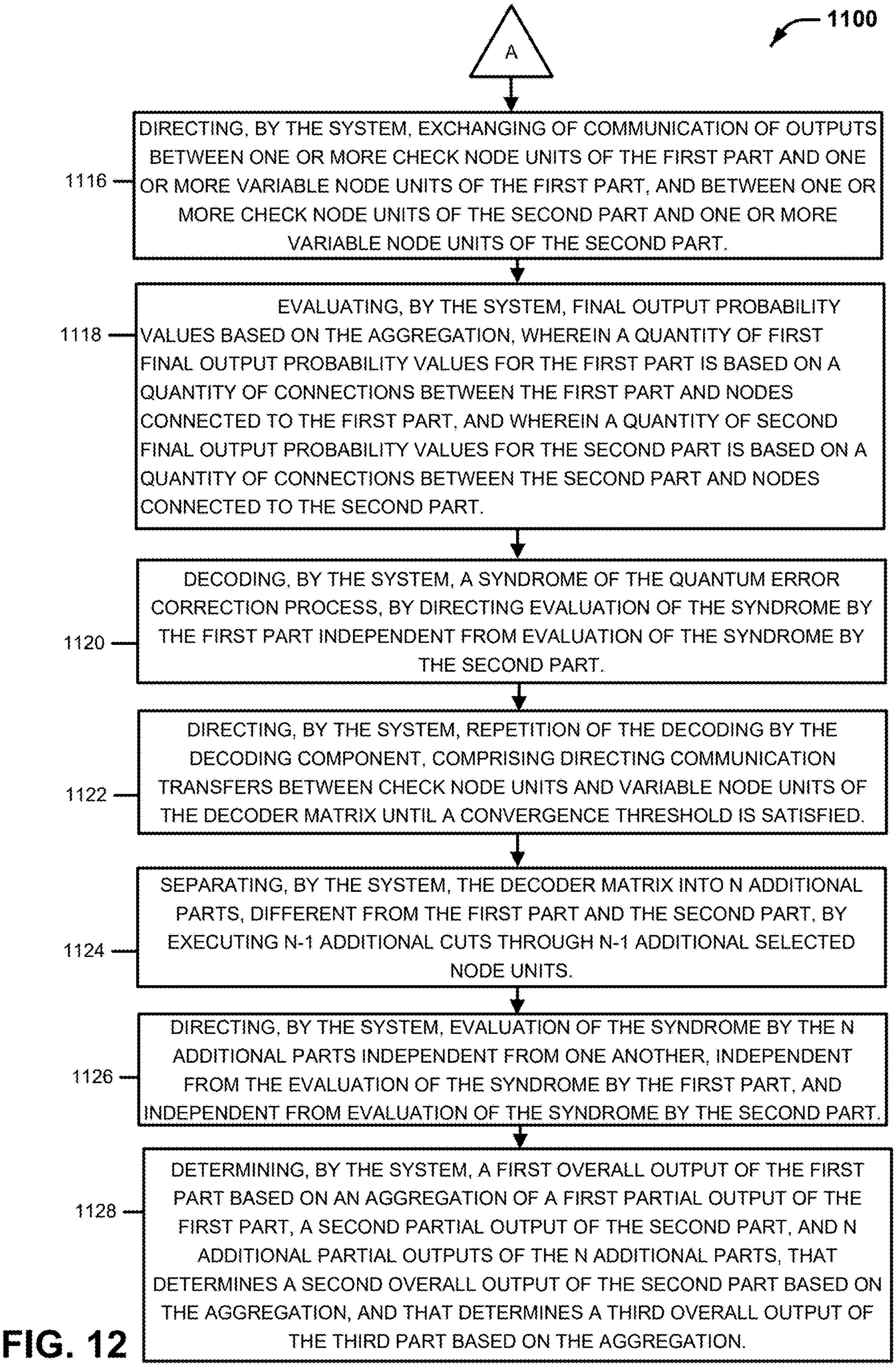
FIG. 12 illustrates a continuation of the flow diagram of FIG. 11 of one or more processes that can be performed by the non-limiting system of FIG. 2, in accordance with one or more embodiments described herein.

As a summary of the above-described processes, referring next to FIGS. 11 and 12, illustrated is a flow diagram. The flow diagram provides an example, non-limiting method 1100 that can provide a process for quantum error correction using a belief propagation method allowing for out of context synthesis, in accordance with one or more embodiments described herein, such as the non-limiting system 200 of FIG. 2. While the non-limiting method 1100 is described relative to the non-limiting system 200 of FIG. 2, the non-limiting method 1100 can be applicable also to other systems described herein, such as the non-limiting system 100 of FIG. 1. Repetitive description of like elements and/or processes employed in respective embodiments is omitted for sake of brevity.

At 1102, the non-limiting method 1100 can comprise separating, by a system operatively coupled to a processor (e.g., separating component 214 coupled to processor 206), a decoder matrix (e.g., decoder matrix 240), representing node units (e.g., node units 242) a quantum error correction process (e.g., QEC process 238), into a first part (e.g., first part 244A) and a second part (e.g., second part 244B), by executing a cut (e.g., cut 245) through a selected node unit (e.g., selected node unit 242S), of the node units.

In one or more embodiments, the selected node unit is a check node unit (e.g., CNU 242C), wherein the first part represents a first check unit part (e.g., first check unit part 242A) of the check node unit, and wherein the second part represents a second check node unit part (e.g., second check node unit part 242B) of the check node unit.

In one or more other embodiments, the selected node unit is a variable node unit, wherein the first part represents a first variable unit part (e.g., first variable node unit part 242A) of the variable node unit, and wherein the second part represents a second variable node unit part (e.g., second variable node unit part 242B) of the variable node unit.

At 1104, non-limiting method 1100 can comprise identifying, by the system (e.g., evaluating component 216), first minimum probability values (e.g. first minima 721), being absolute values of probabilities of the nodes connected to the first part, and second minimum probability values (e.g., second minima 722), being absolute values of probabilities of the nodes connected to the second part.

At 1106, the non-limiting method 1000 can comprise identifying, by the system (e.g., evaluating component 216), a first parity value (e.g., first parity value 711), being an exclusive-or value (XOR) of bits of the nodes connected to the first part, and a second parity value (e.g., second parity value 712), being an XOR of bits of the nodes connected to the second part.

At 1108, the non-limiting method 1100 can comprise directing, by the system (e.g., communicating component 215), exchanging of communication (e.g., communications 782, 903) of at least one of a partial output of the first part (e.g., 711 and 721) to the second part, or a partial output of the second part (e.g., 712 and 722) to the first part.

At 1110, the non-limiting method 1100 can comprise generating, by the system (e.g., overhead component 218), an aggregation (e.g., aggregation 260) by combining first minimum probability values of the first part with second minimum probability values from the second part, and by combining a first parity value from the first part with a second parity value from the second part.

At 1112, the non-limiting method 1100 can comprise determining, by the system (e.g., overhead component 218), a first overall output (e.g., overall output 264 of first part 244A) of the first part based on the aggregation of a first partial output of the first part and a second partial output of the second part, and that determines a second overall output (e.g., overall output 264 of second part 244B) of the second part also based on the aggregation.

At 1114, the non-limiting method 1100 can comprise determining, by the system (e.g., output component 222), whether an overall output (e.g., overall output 264) has been obtained. If yes, the non-limiting method 1100 can proceed to step 1118. If not, the non-limiting method 1000 can return to step 1112.

At 1116, the non-limiting method 1000 can comprise directing, by the system (e.g., communicating component 215), exchanging of communication of outputs between one or more check node units of the first part and one or more variable node units of the first part, and between one or more check node units of the second part and one or more variable node units of the second part.

At 1118, the non-limiting method 1100 can comprise evaluating, by the system (e.g., output component 222), final output probability values (e.g., final output probability values 268) based on the aggregation, wherein a quantity of first final output probability values (e.g., first final output probability values 268A) for the first part is based on a quantity of connections between the first part and nodes connected to the first part, and wherein a quantity of second final output probability values (e.g., second final output probability values 268B) for the second part is based on a quantity of connections between the second part and nodes connected to the second part.

At 1120, the non-limiting method 1000 can comprise decoding, by the system (e.g., decoding component 224), a syndrome (e.g., syndrome 250) of the quantum error correction process (e.g., QEC process 238) by directing evaluation of the syndrome by the first part independent from evaluation of the syndrome by the second part.

At 1122, the non-limiting method 1100 can comprise directing, by the system (e.g., iterating component 226), repetition of the decoding by the decoding component, comprising directing communication transfers between check node units (e.g., check node units 242C) and variable node units (e.g., variable node units 242V) of the decoder matrix until a convergence threshold (e.g., convergence threshold 420) is satisfied.

At 1124, the non-limiting method 1000 can comprise separating, by the system (e.g., separating component 214), the decoder matrix into a third part (e.g., third part 244C), different from the first part and the second part, by executing n−1 additional cuts through n−1 additional selected node units.

At 1126, the non-limiting method 1100 can comprise directing, by the system (e.g., decoding component 224), synthesis of the third part independent from synthesis of the first part and independent from synthesis of the second part.

At 1128, the non-limiting method 1100 can comprise determining, by the system (e.g., overhead component 218), a first overall output of the first part based on an aggregation of a first partial output of the first part, a second partial output of the second part, and n additional partial outputs of the n additional parts, that determines a second overall output of the second part based on the aggregation, and that determines a third overall output of the third part based on the aggregation.

Additional Summary

For simplicity of explanation, the computer-implemented and non-computer-implemented methodologies provided herein are depicted and/or described as a series of acts. It is to be understood that the subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture for transporting and transferring the computer-implemented methodologies to computers. The term article of manufacture, as used herein, is intended to encompass a computer program accessible from any computer-readable device or storage media.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

In summary, the one or more embodiments described herein can provide a system comprising a separating component 114, 214 that separates a decoder matrix 140, 240, representing node units 142, 242 of a quantum error correction process 138, 238, into a first part 144A, 244A and a second part 144B, 244B, by executing a cut 145, 245 through a selected node unit 142S, 242S, of the node units

142, 242, and a decoding component 124, 224 that decodes a syndrome 150, 250, of the quantum error correction process 138, 238, by directing evaluation of the syndrome be the first part 144A, 244A independent from evaluation of the syndrome by the second part 144B, 244B.

In view of the one or more embodiments described herein, a practical application of the one or more systems, computer-implemented methods and/or computer program products described herein can be a reduction in time, energy, power, bandwidth, memory, qubit usage and/or user entity labor employed to perform a belief propagation-based quantum error correction process. In one or more cases, a practical application can be the ability to reach convergence where an existing framework would instead have faulted (e.g., failed). The reduction in resources (e.g., time, energy, power, bandwidth, memory, etc.) can be due to the use of out of context synthesis for identified/separated parts of a decoder matrix. In one or more cases, parts can be repeated along a decoder matrix, and thus synthesis performed for one part can be applied to a repeated version of that part at another location of a decoder matrix or corresponding Tanner graph. As a result, use of the one or more embodiments described herein can allow for reduced and/or more efficient use of a classical computer supporting execution of a quantum computer, as compared to existing frameworks.

In connection therewith, the one or more embodiments described herein can provide useful and practical applications of computers, thus providing enhanced (e.g., improved and/or optimized) quantum error correction execution as compared to existing frameworks for quantum error correction, particularly corresponding to belief propagation methods. Overall, such computerized tools can constitute a concrete and tangible technical improvement in the field of quantum error correction. That is, the one or more embodiments described herein can provide a process to identify, isolate, and/or separately perform synthesis for one or more parts of a decoder matrix generated by a belief propagation process.

One or more embodiments described herein can be employed in scale, such as to perform two or more processes at least partially in parallel with one another. For example, one or more parts can be synthesized, out of context from a remainder of a decoder matrix, at least partially at a same time as one another. For another example, identification of parts, whether or not being repeated parts, can be performed for two or more parts at least partially at a same time as one another. Furthermore, two or more of these above-noted processes can be at least partially operated at a same time as one another.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to belief propagation-based quantum error correction, as compared to existing systems and/or techniques unable to provide such efficiencies. Systems, computer-implemented methods and/or computer program products providing performance of these processes are of great utility in the fields of quantum error correction and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively automatically or even partially automatically generate and/or modify a decoder matrix, access information output from a quantum system relative to check qubits and/or other measurement readouts, and/or operate a decoder matrix as the one or more embodiments described herein can provide these processes. Moreover, neither can the human mind nor a human with pen and paper conduct these processes, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing one or more of the one or more operations described herein.

To provide additional summary, a listing of embodiments and features thereof is provided.

A system, comprising: a separating component that separates a decoder matrix, representing node units of a quantum error correction process, into a first part and a second part, by executing a cut through a selected node unit, of the node units; and a decoding component that decodes a syndrome, of the quantum error correction process, by directing evaluation of the syndrome by the first part independent from evaluation of the syndrome by the second part.

The system of the preceding paragraph, wherein the selected node unit is a check node unit, wherein the first part represents a first check unit part of the check node unit, and wherein the second part represents a second check node unit part of the check node unit.

The system of any preceding paragraph, wherein the selected node unit is a variable node unit, wherein the first part represents a first variable unit part of the variable node unit, and wherein the second part represents a second variable node unit part of the variable node unit.

The system of any preceding paragraph, wherein the computer executable components further comprise: a communicating component that directs exchanging of communication of outputs between one or more check node units of the first part and one or more variable node units of the first part, and between one or more check node units of the second part and one or more variable node units of the second part.

The system of any preceding paragraph, wherein the computer executable components further comprise: a communicating component that directs exchanging of communication of at least one of a partial output of the first part to the second part, or a partial output of the second part to the first part.

The system of any preceding paragraph, wherein the computer executable components further comprise: an overhead component that determines a first overall output of the first part based on an aggregation of a first partial output of the first part and a second partial output of the second part, and that determines a second overall output of the second part based on the aggregation.

The system of any preceding paragraph, wherein the computer executable components further comprise: an overhead component that generates the aggregation by combining first minimum probability values of the first part with second minimum probability values from the second part, and by combining a first parity value from the first part with a second parity value from the second part.

The system of any preceding paragraph, wherein the computer executable components further comprise: a output component that evaluates final output probability values based on the aggregation, wherein a quantity of first final output probability values for the first part is based on a quantity of connections between the first part and nodes connected to the first part, and wherein a quantity of second final output probability values for the second part is based on a quantity of connections between the second part and nodes connected to the second part.

The system of any preceding paragraph, wherein the computer executable components further comprise: a evaluating component that identifies first minimum probability values, being absolute values of probabilities of nodes, of the node units, connected to the first part, and second minimum probability values, being absolute values of probabilities of the nodes, of the node units, connected to the second part, wherein the evaluating component further identifies a first parity value, being an exclusive-or value (XOR) of bits of the nodes connected to the first part, and a second parity value, being an XOR of bits of the nodes connected to the second part.

The system of any preceding paragraph, wherein the separating component further separates the decoder matrix into n additional parts, different from the first part and the second part, by executing n−1 additional cuts through n−1 additional selected node units, and wherein the decoding component directs evaluation of the syndrome by the n additional parts independent from one another, independent from the evaluation by the first part, and independent from the evaluation by the second part.

The system of any preceding paragraph, wherein the computer executable components further comprise: an overhead component that determines a first overall output of the first part based on an aggregation of a first partial output of the first part, a second partial output of the second part, and n additional partial outputs of the n additional parts, that determines a second overall output of the second part based on the aggregation, and that determines a third overall output of the third part based on the aggregation.

A computer-implemented method, comprising: separating, by a system operatively coupled to a processor, a decoder matrix, representing node units of a quantum error correction process, and realized by cells defining rows and columns of the decoder matrix, into a first part and a second part, by executing a cut through a selected node unit, of the node units; and decoding, by the system, a syndrome, of the quantum error correction process, by directing evaluation of the syndrome by the first part independent from evaluation of the syndrome by the second part.

The computer-implemented method of the preceding paragraph, wherein the selected node unit is a check node unit, wherein the first part represents a first check unit part of the check node unit, and wherein the second part represents a second check node unit part of the check node unit, or wherein the selected node unit is a variable node unit, wherein the first part represents a first variable unit part of the variable node unit, and wherein the second part represents a second variable node unit part of the variable node unit.

The computer-implemented method of any preceding paragraph, further comprising: directing, by the system, communication of outputs between one or more check node units of the first part and one or more variable node units of the first part, and between one or more check node units of the second part and one or more variable node units of the second part.

The computer-implemented method of any preceding paragraph, further comprising: determining, by the system, a first overall output of the first part based on an aggregation of a first partial output of the first part and a second partial output of the second part; and determining, by the system, a second overall output of the second part based on the aggregation.

The computer-implemented method of any preceding paragraph, further comprising: separating, by the system, the decoder matrix into a third part, different from the first part and the second part, by executing a second cut through a second selected node unit; directing, by the system, evaluation of the syndrome by the third part independent from the evaluation by the first part and independent from the evaluation by the second part; determining, by the system, a first overall output of the first part based on an aggregation of a first partial output of the first part, a second partial output of the second part, and a third partial output of the third part; determining, by the system, a second overall output of the second part based on the aggregation; and determining, by the system, a third overall output of the third part based on the aggregation.

A computer program product facilitating use of a decoder matrix of a quantum error correction process, the non-transitory, computer-readable medium having program instructions embodied therewith, the program instructions being executable to: separate a decoder matrix, representing node units of a quantum error correction process, and realized by cells defining rows and columns of the decoder matrix, into a first part and a second part, by executing a cut through a selected node unit, of the node units; and decode a syndrome, of the quantum error correction process, by directing evaluation of the syndrome by the first part independent from evaluation of the syndrome by the second part.

The computer program product of the preceding paragraph, wherein the selected node unit is a check node unit, wherein the first part represents a first check unit part of the check node unit, and wherein the second part represents a second check node unit part of the check node unit, or wherein the selected node unit is a variable node unit, wherein the first part represents a first variable unit part of the variable node unit, and wherein the second part represents a second variable node unit part of the variable node unit.

The computer program product of any preceding paragraph, wherein the program instructions are further executable by the processor to cause the processor to: direct, by the processor, communication of outputs between one or more check node units of the first part and one or more variable node units of the first part, and between one or more check node units of the second part and one or more variable node units of the second part.

The computer program product of any preceding paragraph, wherein the program instructions are further executable by the processor to cause the processor to: determine, by the processor, a first overall output of the first part based on an aggregation of a first partial output of the first part and a second partial output of the second part; and determine, by the processor, a second overall output of the second part based on the aggregation.

Computing Environment Description

Turning next to FIG. 13, a detailed description is provided of additional context for the one or more embodiments described herein at FIGS. 1-12.

FIG. 13 and the following discussion are intended to provide a brief, general description of a suitable computing environment 1300 in which one or more embodiments described herein at FIGS. 1-12 can be implemented. For example, various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1300 contains an example of an environment for the execution of at least some of the computer code involved in performing the inventive methods, such as translation of an original source code based on a configuration of a QEC code 1380. In addition to block 1380, computing environment 1300 includes, for example, computer 1301, wide area network (WAN) 1302, end user device (EUD) 1303, remote server 1304, public cloud 1305, and private cloud 1306. In this embodiment, computer 1301 includes processor set 1310 (including processing circuitry 1320 and cache 1321), communication fabric 1311, volatile memory 1312, persistent storage 1313 (including operating system 1322 and block 1380, as identified above), peripheral device set 1314 (including user interface (UI), device set 1323, storage 1324, and Internet of Things (IoT) sensor set 1325), and network module 1315. Remote server 1304 includes remote database 1330. Public cloud 1305 includes gateway 1340, cloud orchestration module 1341, host physical machine set 1342, virtual machine set 1343, and container set 1344.

COMPUTER 1301 may take the form of a desktop computer, laptop computer, tablet computer, smart phone, smart watch or other wearable computer, mainframe computer, quantum system or any other form of computer or mobile device now known or to be developed in the future that is capable of running a program, accessing a network or querying a database, such as remote database 1330. As is well understood in the art of computer technology, and depending upon the technology, performance of a computer-implemented method may be distributed among multiple computers and/or between multiple locations. On the other hand, in this presentation of computing environment 1300, detailed discussion is focused on a single computer, specifically computer 1301, to keep the presentation as simple as possible. Computer 1301 may be located in a cloud, even though it is not shown in a cloud in FIG. 13. On the other hand, computer 1301 is not required to be in a cloud except to any extent as may be affirmatively indicated.

PROCESSOR SET 1310 includes one, or more, computer processors of any type now known or to be developed in the future. Processing circuitry 1320 may be distributed over multiple packages, for example, multiple, coordinated integrated circuit chips. Processing circuitry 1320 may implement multiple processor threads and/or multiple processor cores. Cache 1321 is memory that is located in the processor chip package and is typically used for data or code that should be available for rapid access by the threads or cores running on processor set 1310. Cache memories are typically organized into multiple levels depending upon relative proximity to the processing circuitry. Alternatively, some, or all, of the cache for the processor set may be located "off chip." In some computing environments, processor set 1310 may be designed for working with qubits and performing quantum computing.

Computer readable program instructions are typically loaded onto computer 1301 to cause a series of operational steps to be performed by processor set 1310 of computer 1301 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1321 and the other storage media discussed below. The program instructions, and associated data, are accessed by processor set 1310 to control and direct performance of the inventive methods. In computing environment 1300, one or more instructions for performing the inventive methods may be stored in block 1380 in persistent storage 1313.

COMMUNICATION FABRIC 1311 is the signal conduction path that allows the various components of computer 1301 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 1312 is any type of volatile memory now known or to be developed in the future. Examples include dynamic type random access memory (RAM) or static type RAM. Typically, the volatile memory is characterized by random access, but this is not required unless affirmatively indicated. In computer 1301, the volatile memory 1312 is located in a single package and is internal to computer 1301, but, alternatively or additionally, the volatile memory may be distributed over multiple packages and/or located externally with respect to computer 1301.

PERSISTENT STORAGE 1313 is any form of non-volatile storage for computers that is now known or to be developed in the future. The non-volatility of this storage means that the stored data is maintained regardless of whether power is being supplied to computer 1301 and/or directly to persistent storage 1313. Persistent storage 1313 may be a read only memory (ROM), but typically at least a portion of the persistent storage allows writing of data, deletion of data and re-writing of data. Some familiar forms of persistent storage include magnetic disks and solid-state storage devices. Operating system 1322 may take several forms, such as various known proprietary operating systems or open-source Portable Operating System Interface type operating systems that employ a kernel. The code included in block 1380 typically includes at least some of the computer code involved in performing the inventive methods.

PERIPHERAL DEVICE SET 1314 includes the set of peripheral devices of computer 1301. Data communication connections between the peripheral devices and the other components of computer 1301 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1323 may include components such as a display screen, speaker, microphone, wearable devices (such as goggles and smart watches), keyboard, mouse, printer, touchpad, game controllers, and haptic devices. Storage 1324 is external storage, such as an external hard drive, or insertable storage, such as an SD card. Storage 1324 may be persistent and/or volatile. In some embodiments, storage 1324 may take the form of a quantum computing storage device for storing data in the form of qubits. In embodiments where computer 1301 is required to have a large amount of storage (for example, where computer 1301 locally stores and manages a large database) then this storage may be provided by peripheral storage devices designed for storing large amounts of data, such as a storage area network (SAN) that is shared by multiple, geographically distributed computers. IoT sensor set 1325 is made up of sensors that can be used in Internet of Things applications. For example, one sensor may be a thermometer, and another sensor may be a motion detector.

NETWORK MODULE 1315 is the collection of computer software, hardware, and firmware that allows computer 1301 to communicate with other computers through WAN 1302. Network module 1315 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1315 are performed on the same physical hardware device. In other embodiments (for example, embodiments that utilize software-defined networking (SDN)), the control functions and the forwarding functions of network module 1315 are performed on physically separate devices, such that the control functions manage several different network hardware devices. Computer readable program instructions for performing the inventive methods can typically be downloaded to computer 1301 from an external computer or external storage device through a network adapter card or network interface included in network module 1315.

WAN 1302 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 1303 is any computer system that is used and controlled by an end user (for example, a customer of an enterprise that operates computer 1301) and may take any of the forms discussed above in connection with computer 1301. EUD 1303 typically receives helpful and useful data from the operations of computer 1301. For example, in a hypothetical case where computer 1301 is designed to provide a recommendation to an end user, this recommendation would typically be communicated from network module 1315 of computer 1301 through WAN 1302 to EUD 1303. In this way, EUD 1303 can display, or otherwise present, the recommendation to an end user. In some embodiments, EUD 1303 may be a client device, such as thin client, heavy client, mainframe computer, desktop computer and so on.

REMOTE SERVER 1304 is any computer system that serves at least some data and/or functionality to computer 1301. Remote server 1304 may be controlled and used by the same entity that operates computer 1301. Remote server 1304 represents the machine that collects and stores helpful and useful data for use by other computers, such as computer 1301. For example, in a hypothetical case where computer 1301 is designed and programmed to provide a recommendation based on historical data, then this historical data may be provided to computer 1301 from remote database 1330 of remote server 1304.

PUBLIC CLOUD 1305 is any computer system available for use by multiple entities that provides on-demand availability of computer system resources and/or other computer capabilities, especially data storage (cloud storage) and computing power, without direct active management by the scale. The direct and active management of the computing resources of public cloud 1305 is performed by the computer hardware and/or software of cloud orchestration module 1341. The computing resources provided by public cloud 1305 are typically implemented by virtual computing environments that run on various computers making up the computers of host physical machine set 1342, which is the universe of physical computers in and/or available to public cloud 1305. The virtual computing environments (VCEs) typically take the form of virtual machines from virtual machine set 1343 and/or containers from container set 1344. It is understood that these VCEs may be stored as images and may be transferred among and between the various physical machine hosts, either as images or after instantiation of the VCE. Cloud orchestration module 1341 manages the transfer and storage of images, deploys new instantiations of VCEs and manages active instantiations of VCE deployments. Gateway 1340 is the collection of computer software, hardware, and firmware that allows public cloud 1305 to communicate via WAN 1302.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1306 is similar to public cloud 1305, except that the computing resources are only available for use by a single enterprise. While private cloud 1306 is depicted as being in communication with WAN 1302, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1305 and private cloud 1306 are both part of a larger hybrid cloud.

Additional Closing Information

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function. In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented at least partially in parallel with one or more other program modules. Generally, program modules include routines, programs, components and/or data structures that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), and/or microprocessor-based or programmable consumer and/or industrial electronics. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform" and/or "interface" can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random-access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A system, comprising:

a memory configured to store computer-executable components; and a processor configured to execute at least one of the computer-executable components that:

performs a quantum error correction process to address an error at a quantum output of a quantum computing system, wherein the performing the quantum error correction process comprises:

separating a decoder matrix, representing node units of the quantum error correction process, and realized by cells defining rows and columns of the decoder matrix, into a first part and a second part, by executing a cut through a selected node unit, of the node units, wherein the cut separates the selected node unit into a first node unit part, corresponding to the first part, and a second node unit part, corresponding to the second part; and decoding a syndrome, of the quantum error correction process, by directing evaluation of the syndrome by the first part independent from evaluation of the syndrome by the second part.

2. The system of claim 1, wherein the selected node unit is a check node unit, wherein the first node unit part represents a first check node unit part of the check node unit, and wherein the second node unit part represents a second check node unit part of the check node unit.

3. The system of claim 1, wherein the selected node unit is a variable node unit, wherein the first node unit part represents a first variable node unit part of the variable node unit, and wherein the second node unit part represents a second variable node unit part of the variable node unit.

4. The system of claim 1, wherein the performing the quantum error correction process further comprises:

directing exchanging of communication of outputs between one or more check node units of the first part and one or more variable node units of the first part, and between one or more check node units of the second part and one or more variable node units of the second part.

5. The system of claim 1, wherein the performing the quantum error correction process further comprises:

directing exchanging of communication of at least one of a partial output of the first part to the second part, or a partial output of the second part to the first part.

6. The system of claim 1, wherein the performing the quantum error correction process further comprises:

determining a first overall output of the first part based on an aggregation of a first partial output of the first part and a second partial output of the second part, and that determines a second overall output of the second part based on the aggregation.

7. The system of claim 6, wherein the performing the quantum error correction process further comprises:

generating the aggregation by combining first minimum probability values of the first part with second minimum probability values from the second part, and by combining a first parity value from the first part with a second parity value from the second part.

8. The system of claim 6, wherein the performing the quantum error correction process further comprises:

evaluating final output probability values based on the aggregation, wherein a quantity of first final output probability values for the first part is based on a quantity of connections between the first part and nodes connected to the first part, and wherein a quantity of second final output probability values for the second part is based on a quantity of connections between the second part and nodes connected to the second part.

9. The system of claim 1, wherein the performing the quantum error correction process further comprises:

identifying first minimum probability values, being absolute values of probability values of nodes, of the node units, connected to the first part, and second minimum probability values, being absolute values of probability values of the nodes, of the node units, connected to the second part, and identifying a first parity value, being an exclusive-or value (XOR) of bits of the nodes connected to the first part, and a second parity value, being an XOR of bits of the nodes connected to the second part.

10. The system of claim 1, wherein the performing the quantum error correction process further comprises:

separating the decoder matrix into n additional parts, different from the first part and the second part, by executing n−1 additional cuts through n−1 additional selected node units, and directing evaluation of the syndrome by the n additional parts independent from one another, independent from the evaluation by the first part, and independent from the evaluation by the second part.

11. The system of claim 10, wherein the performing the quantum error correction process further comprises:

determining a first overall output of the first part based on an aggregation of a first partial output of the first part, a second partial output of the second part, and n additional partial outputs of the n additional parts, that determines a second overall output of the second part based on the aggregation, and that determines a third overall output based on the aggregation.

12. A computer-implemented method, comprising:

performing, by a system operatively coupled to a processor, a quantum error correction process to address an error at a quantum output of a quantum computing system, wherein the performing the quantum error correction process comprises:

separating a decoder matrix, representing node units of the quantum error correction process, and realized by cells defining rows and columns of the decoder matrix, into a first part and a second part, by executing a cut through a selected node unit, of the node units, wherein the cut separates the selected node unit into a first node unit part, corresponding to the first part, and a second node unit part, corresponding to the second part; and decoding a syndrome, of the quantum error correction process, by directing evaluation of the syndrome by the first part independent from evaluation of the syndrome by the second part.

13. The computer-implemented method of claim 12, wherein the selected node unit is a check node unit, wherein the first node unit part represents a first check node unit part of the check node unit, and wherein the second node unit part represents a second check node unit part of the check node unit, or wherein the selected node unit is a variable node unit, wherein the first node unit part represents a first variable node unit part of the variable node unit, and wherein the second node unit part represents a second variable node unit part of the variable node unit.

14. The computer-implemented method of claim 12, wherein the performing the quantum error correction process further comprises:

directing communication of outputs between one or more check node units of the first part and one or more variable node units of the first part, and between one or more check node units of the second part and one or more variable node units of the second part.

15. The computer-implemented method of claim 12, wherein the performing the quantum error correction process further comprises:

determining a first overall output of the first part based on an aggregation of a first partial output of the first part and a second partial output of the second part; and determining a second overall output of the second part based on the aggregation.

16. The computer-implemented method of claim 12, wherein the performing the quantum error correction process further comprises:

separating the decoder matrix into a third part, different from the first part and the second part, by executing a second cut through a second selected node unit;

directing evaluation of the syndrome by the third part independent from the evaluation by the first part and independent from the evaluation by the second part;

determining a first overall output of the first part based on an aggregation of a first partial output of the first part, a second partial output of the second part, and a third partial output of the third part;

determining a second overall output of the second part based on the aggregation; and determining a third overall output of the third part based on the aggregation.

17. A non-transitory, computer-readable medium facilitating use of a decoder matrix of a quantum error correction process, the non-transitory, computer-readable medium having program instructions embodied therewith, the program instructions being executable by a processor to:

performs the quantum error correction process to address an error at a quantum output of a quantum computing system, wherein the performing the quantum error correction process comprises:

separating the decoder matrix, representing node units of the quantum error correction process, and realized by cells defining rows and columns of the decoder matrix, into a first part and a second part, by executing a cut through a selected node unit, of the node units, wherein the cut separates the selected node unit into a first node unit part, corresponding to the first part, and a second node unit part, corresponding to the second part; and decoding a syndrome, of the quantum error correction process, by directing evaluation of the syndrome by the first part independent from evaluation of the syndrome by the second part.

18. The non-transitory, computer-readable medium of claim 17, wherein the selected node unit is a check node unit, wherein the first node unit part represents a first check node unit part of the check node unit, and wherein the second node unit part represents a second check node unit part of the check node unit, or wherein the selected node unit is a variable node unit, wherein the first node unit part represents a first variable node unit part of the variable node unit, and wherein the second node unit part represents a second variable node unit part of the variable node unit.

19. The non-transitory, computer-readable medium of claim 17, wherein the program instructions are further executable by the processor to cause the processor to:

directing communication of outputs between one or more check node units of the first part and one or more variable node units of the first part, and between one or more check node units of the second part and one or more variable node units of the second part.

20. The non-transitory, computer-readable medium of claim 17, wherein the program instructions are further executable by the processor to cause the processor to:

determining a first overall output of the first part based on an aggregation of a first partial output of the first part and a second partial output of the second part; and determining a second overall output of the second part based on the aggregation.

* * * * *